(12) United States Patent
Ihara

(10) Patent No.: US 7,583,942 B2
(45) Date of Patent: Sep. 1, 2009

(54) TUNING DEVICE AND RADIO-WAVE CORRECTED TIMEPIECE

(75) Inventor: Takashi Ihara, Tokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 411 days.

(21) Appl. No.: 10/549,456

(22) PCT Filed: May 20, 2004

(86) PCT No.: PCT/JP2004/007211

§ 371 (c)(1),
(2), (4) Date: Sep. 14, 2005

(87) PCT Pub. No.: WO2004/105240

PCT Pub. Date: Dec. 2, 2004

(65) Prior Publication Data

US 2006/0176777 A1    Aug. 10, 2006

(30) Foreign Application Priority Data

May 20, 2003    (JP)    ............................. 2003-141573

(51) Int. Cl.
*H04B 1/18* (2006.01)
*G04B 19/22* (2006.01)

(52) U.S. Cl. .............. 455/193.1; 455/193.2; 455/151.1; 455/151.2; 368/21

(58) Field of Classification Search .............. 455/180.4, 455/185.1, 186.1, 188.1, 191.1–191.3, 193.1–193.3, 455/194.2, 340, 352, 151.1, 151.2, 418, 419, 455/420; 368/47, 21
See application file for complete search history.

(56) References Cited

U.S. PATENT DOCUMENTS

| 4,047,112 | A | * | 9/1977 | Sakamoto ................ 455/158.2 |
| 4,216,451 | A |   | 8/1980 | Nishimura et al. |
| 4,315,332 | A | * | 2/1982 | Sakami et al. ........... 455/181.1 |
| 5,428,829 | A | * | 6/1995 | Osburn et al. ............ 455/197.1 |
| 5,455,807 | A | * | 10/1995 | Nepple et al. ................. 368/47 |
| 5,721,783 | A | * | 2/1998 | Anderson .................... 381/328 |
| 5,812,066 | A | * | 9/1998 | Terk et al. .............. 340/825.72 |
| 5,987,304 | A | * | 11/1999 | Latt ............................ 455/17 |

(Continued)

FOREIGN PATENT DOCUMENTS

DE    43 32 798    3/1995

(Continued)

*Primary Examiner*—Duc M Nguyen
(74) *Attorney, Agent, or Firm*—Greer, Burns & Crain, Ltd.

(57) ABSTRACT

A tuning apparatus is provided, wherein the on and off resistances of semiconductor switches within an tuning IC are optimized, so as to provide high sensitivity and superior stability, a wide range of tuned frequency variation, compactness and high performance. The tuning apparatus has a tuning circuit, which has N-channel MOS transistors (N transistors) $5a$ through $5f$, serving as a plurality of semiconductor switches, and a counter circuit 6, which controls the opening and closing of the N transistors, a plurality of capacitors $4a$ through $4f$, which are each connected in series with the plurality of N transistors, and a receiving antenna 2 wherein the total electrostatic capacitance of the plurality of capacitors is varied by the opening and closing of the plurality of N transistors, thereby varying the frequency tuned by the plurality of capacitors and the receiving antenna.

8 Claims, 20 Drawing Sheets

U.S. PATENT DOCUMENTS

| | | | |
|---|---|---|---|
| 6,016,108 A * | 1/2000 | Terk et al. | 340/825.72 |
| 6,081,700 A * | 6/2000 | Salvi et al. | 455/193.3 |
| 6,121,806 A * | 9/2000 | Kono et al. | 327/205 |
| 6,134,188 A | 10/2000 | Ganter et al. | |
| 6,181,218 B1 * | 1/2001 | Clark et al. | 331/177 R |
| 6,239,675 B1 | 5/2001 | Flaxl | |
| 6,549,096 B2 * | 4/2003 | Groves et al. | 333/174 |
| 6,889,036 B2 * | 5/2005 | Ballweber et al. | 455/292 |
| 7,295,822 B2 * | 11/2007 | Sano | 455/181.1 |
| 7,515,887 B2 * | 4/2009 | Saitoh | 455/191.1 |
| 2001/0036811 A1 * | 11/2001 | Kianush et al. | 455/41 |
| 2003/0083836 A1 | 5/2003 | Spencer | |
| 2003/0119469 A1 * | 6/2003 | Karr et al. | 455/307 |

FOREIGN PATENT DOCUMENTS

| | | |
|---|---|---|
| EP | 0 564 236 | 10/1993 |
| EP | 1 426 839 | 6/2004 |
| JP | 6-45958 * | 2/1994 |
| JP | 9-074319 | 3/1997 |
| JP | 2002-082187 | 3/2002 |
| JP | 2003-075561 | 3/2003 |
| WO | WO 03/003130 | 1/2003 |
| WO | WO 03/023526 | 3/2003 |

* cited by examiner

Fig. 2(a)
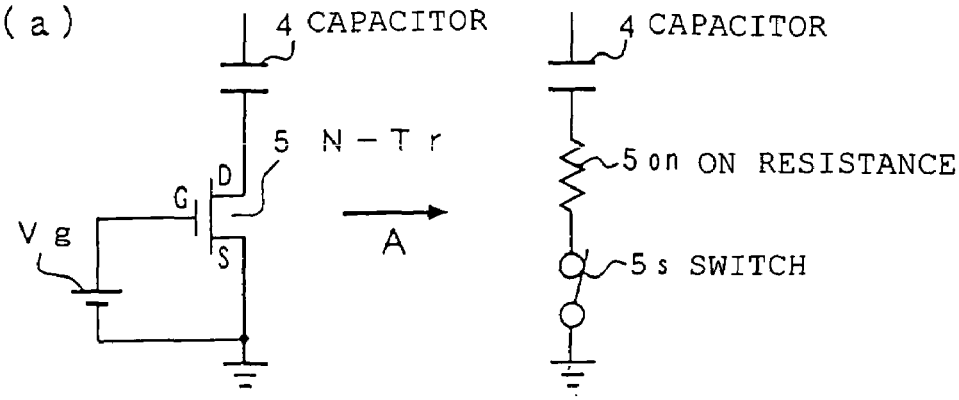
(b)
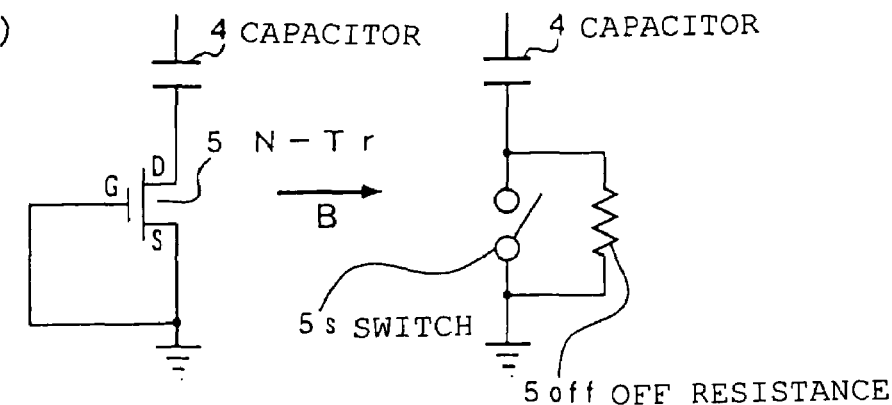
(c)
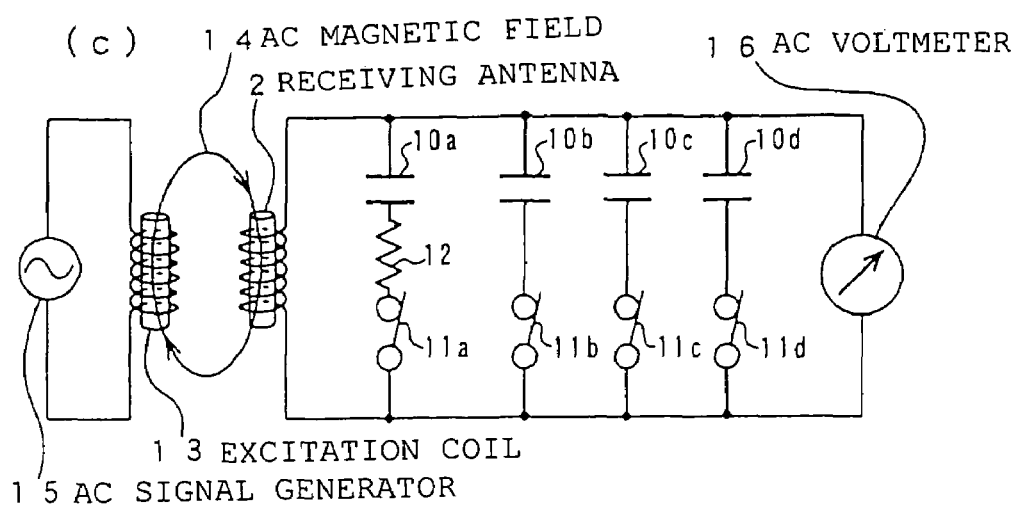

IMPEDANCE RATIO VERSUS ANTENNA GAIN CHARACTERISTICS

Fig. 4
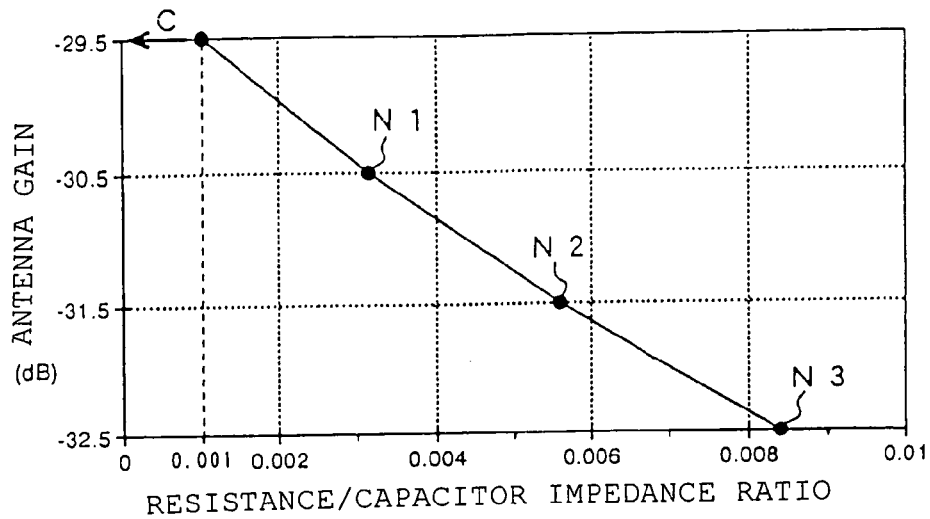
(a) IMPEDANCE RATIO VERSUS ANTENNA GAIN CHARACTERISTICS
(ON RESISTANCE REGION)
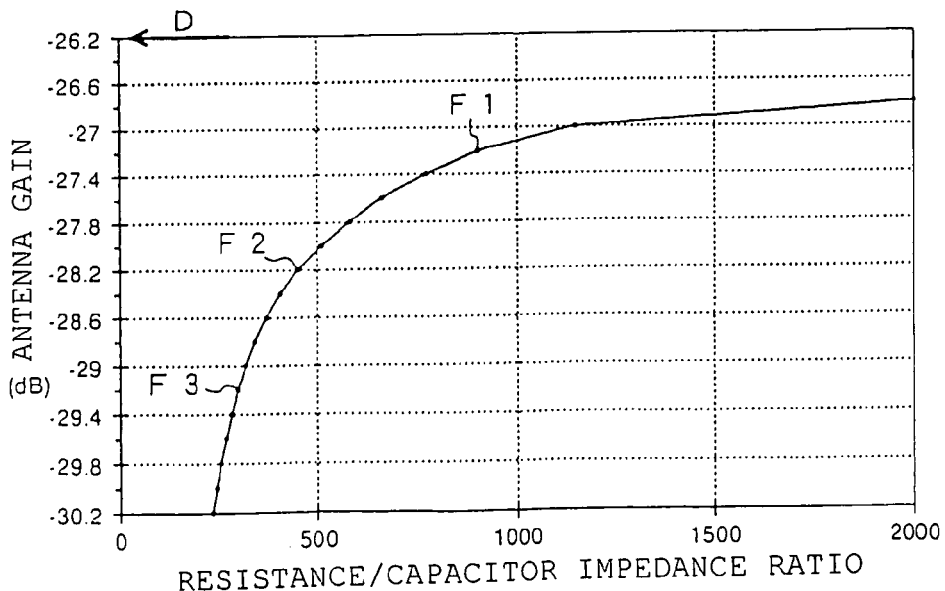
(b) IMPEDANCE RATIO VERSUS ANTENNA GAIN CHARACTERISTICS
(OFF RESISTANCE REGION)

Fig. 6
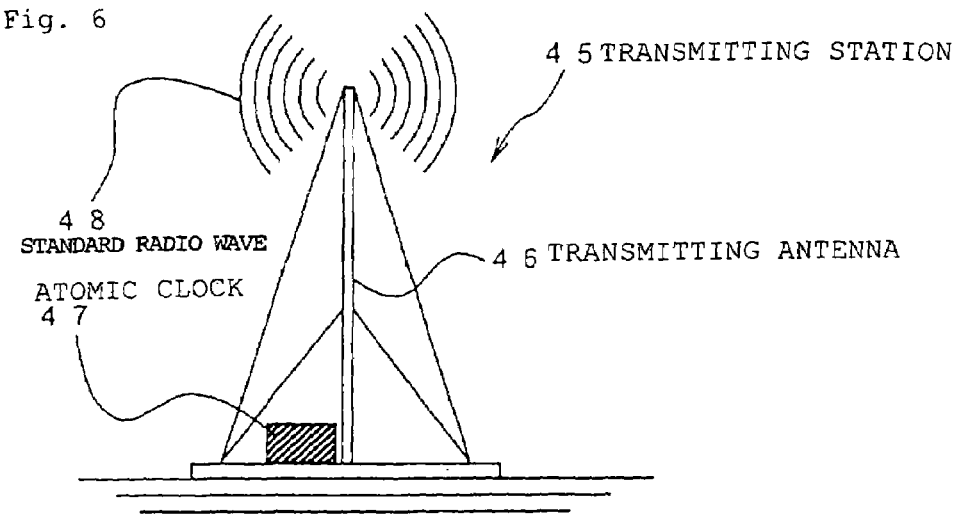
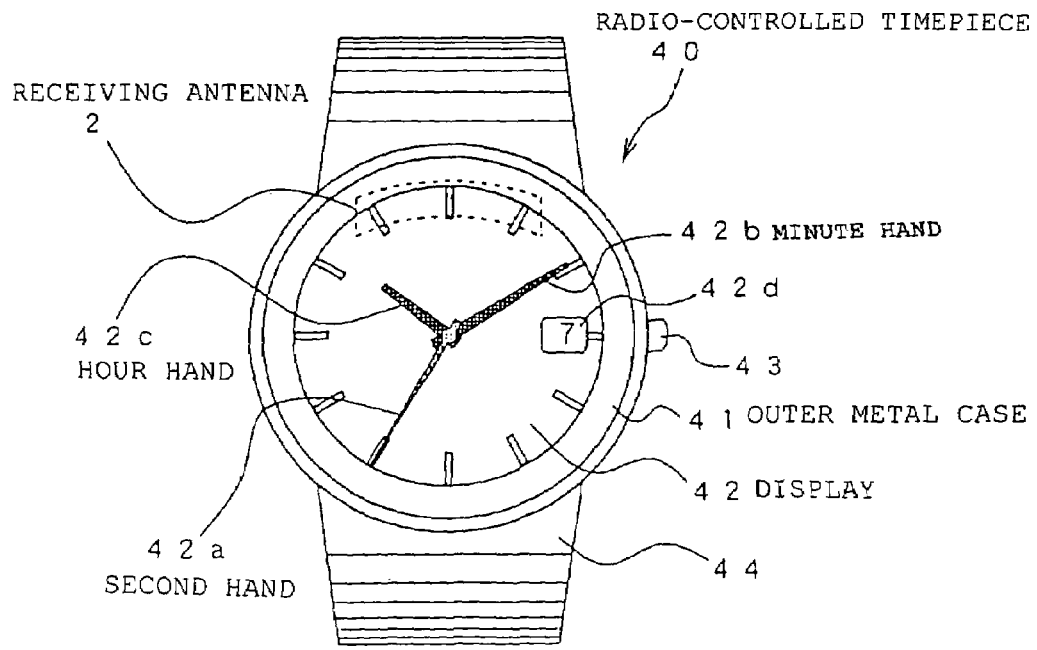

Fig. 10
(a) 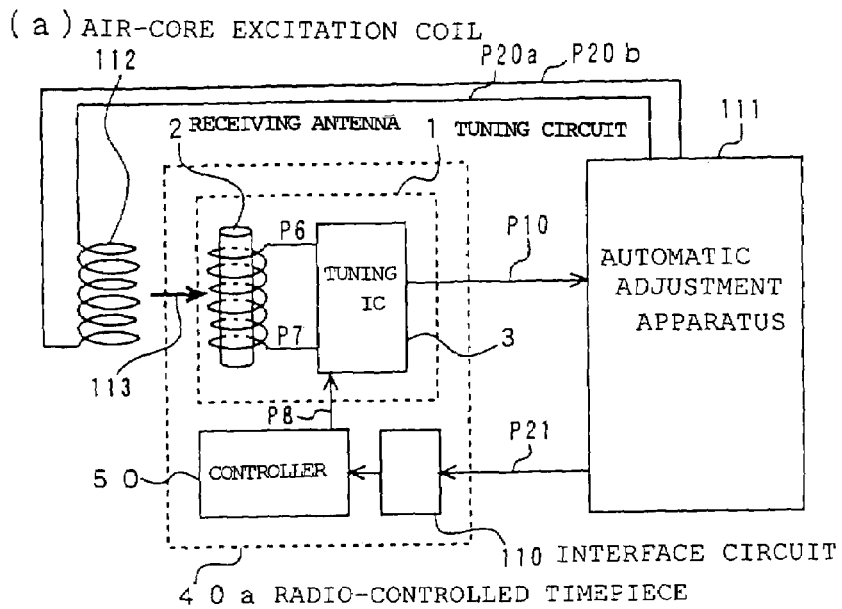
(b) 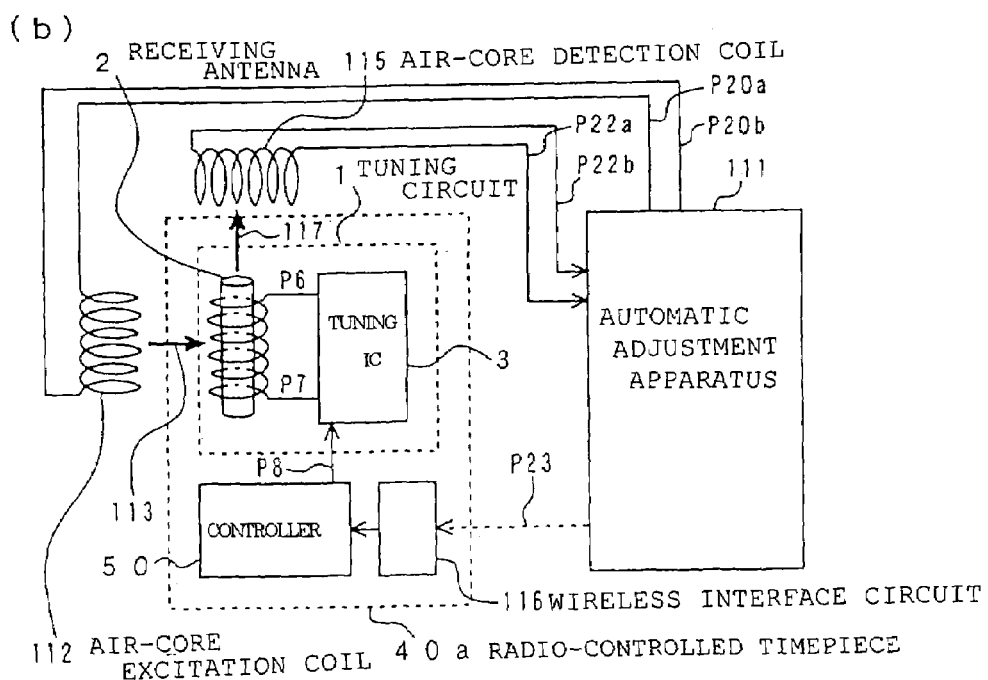

Fig. 11  ANTENNA OUTPUT CHARACTERISTICS
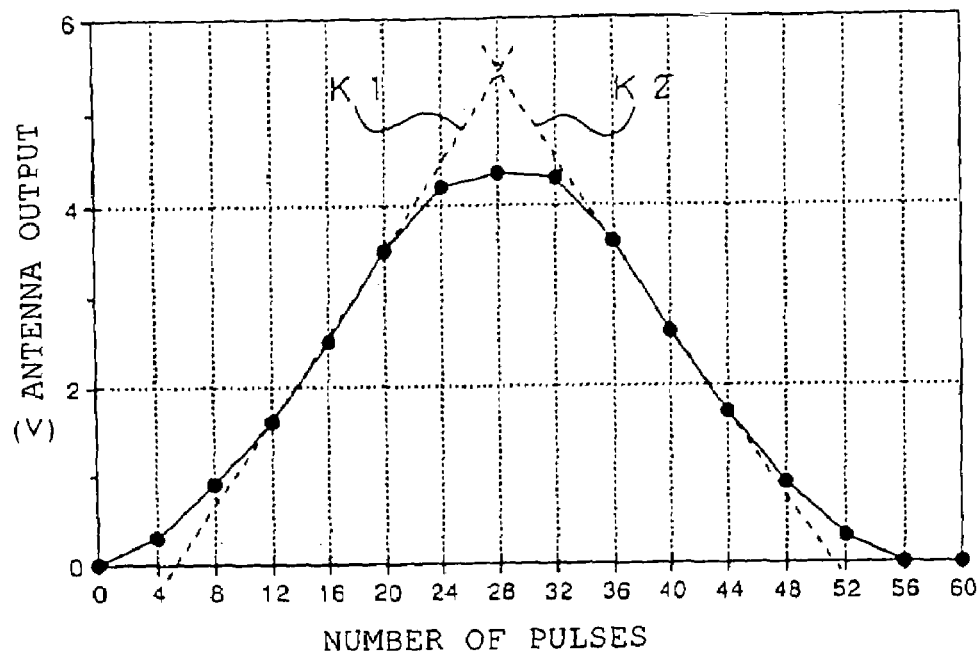
Fig. 23
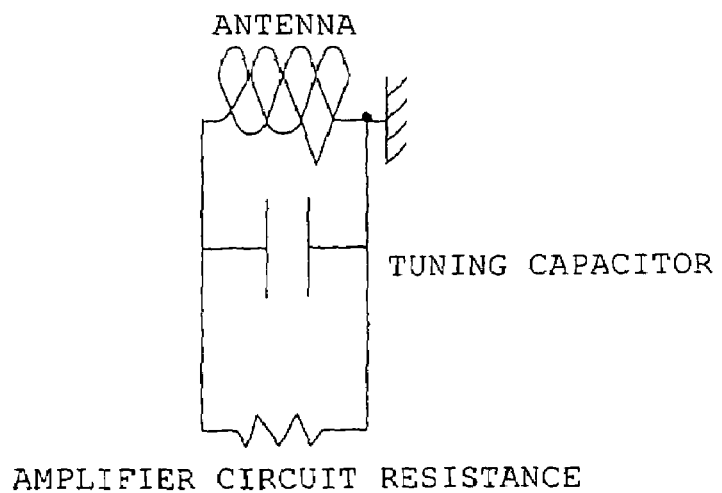

Fig. 12
PRIOR ART
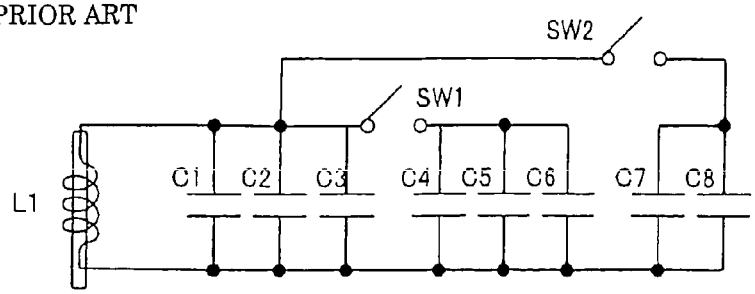
Fig. 13    TUNING CIRCUIT
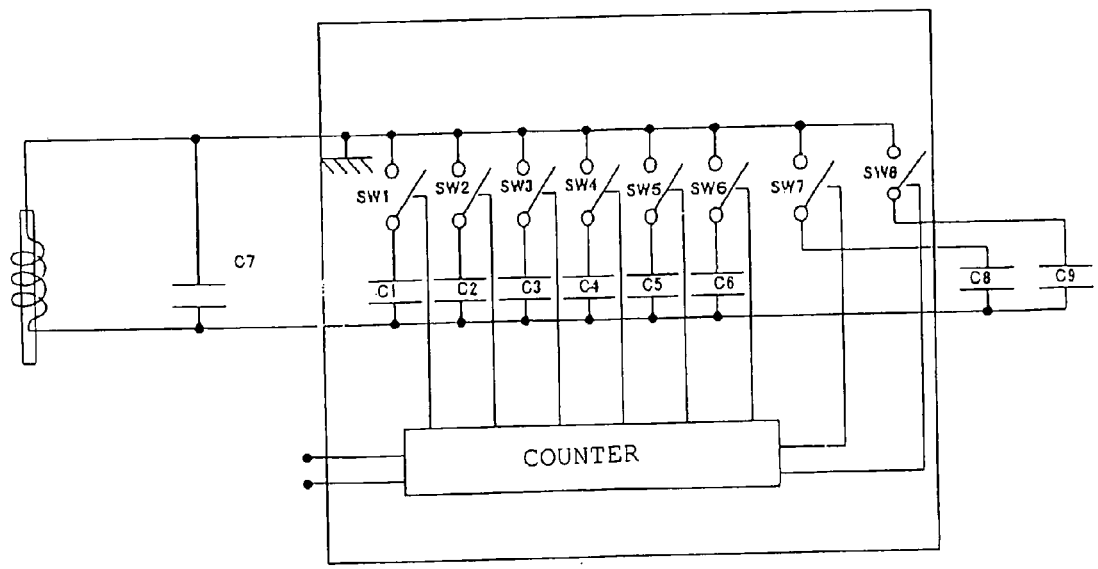

Fig. 17
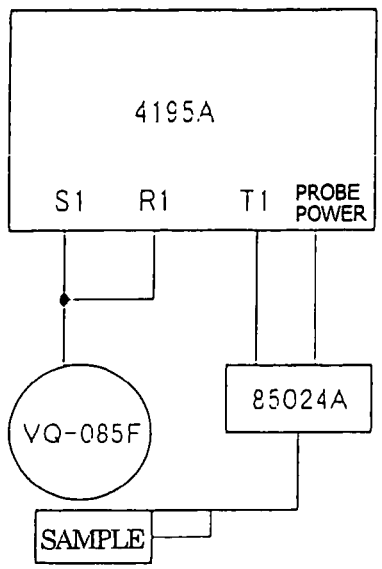
Fig. 18  ANTENNA-TO-SAMPLE DISTANCE
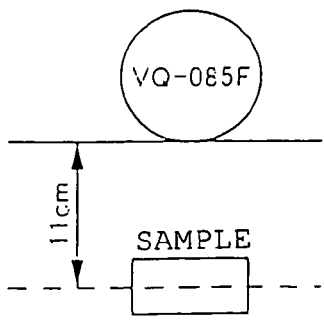
Fig. 19
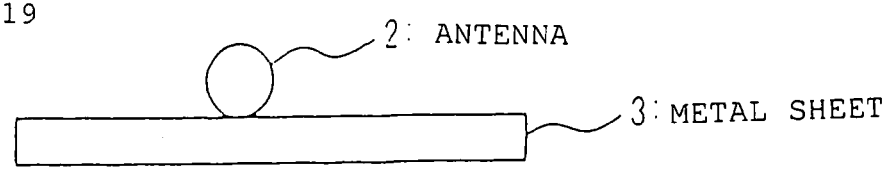
DISTANCE FROM ANTENNA TO METAL SHEET: 0mm Fig. 22  RECEPTION HISTORY INFORMATION TABLE

| ADDRESS | RECEIVED STATION NAME | RECEPTION PROCESSING TIME | RECEIVED LEVEL |
|---|---|---|---|
| 1 | JJY FUKUSHIMA | 3 MINUTES | H |
| 2 | JJY KYUSHU | 6 MINUTES | H |
| 3 | JJY KYUSHU | 5 MINUTES | M |
| 4 | RECEPTION ERROR | — — | — — |
| 5 | DCF77 | 8 MINUTES | L |
| 6 | DCF77 (77.5 kHz) | 7 MINUTES | M |
| 7 | WWVB | 5 MINUTES | M |
| 8 | JJY FUKUSHIMA | 2 MINUTES | H |
| 9 | JJY FUKUSHIMA | 5 MINUTES | H |
| 10 | JJY KYUSHU (60 kHz) | 4 MINUTES | M |
| 11 | WWVB (60 kHz) | 10 MINUTES | L |
| 12 | JJY FUKUSHIMA (40 kHz) | 6 MINUTES | M |
| . | . | . | . |
| . | . | . | . |
| N | . | . | . |

TUNING DEVICE AND RADIO-WAVE CORRECTED TIMEPIECE

BACKGROUND OF THE INVENTION

1. Field of the Invention

The present invention relates to a compact, high-performance tuning apparatus, which receives a radio wave or the like and to an improvement on a method for receiving in a radio-controlled timepiece using the above-noted tuning apparatus.

2. Background Art

In the past, the electronic tuning apparatus used in an electronic tuner of a receiver or in the oscillator of a transmitter generally used a variable-capacitance diode, whereby a voltage applied to the variable-capacitance diode is controlled so as to vary its equivalent electrostatic capacitance, thereby varying the tuned frequency. Because this method, in addition to using a compact, low-cost variable-capacitance diode, enables easy variation of the tuned frequency by controlling the applied voltage, it has an advantage in enabling compact and low-cost implementation of tuners or transmitting circuits. However, because a variable-capacitance diode makes use of the depletion layer of a semiconductor PN junction, a leakage current exists, making it impossible to achieve a tuning circuit with a high Q value.

Also, because the Q value changes with a change in the electrostatic capacitance, it is difficult to achieve a stable tuning circuit. Additionally, because of the limited variable capacitance range of a variable-capacitance diode, it is difficult to vary the tuned frequency over a wide range.

To solve these problems, there was a proposal, such as in the claims and FIG. 3 of the specification of Japanese Unexamined Patent publication (KOKAI) No. 57-99787, in which a plurality of variable-capacitance diodes capable of taking either of a pair of binary conditions in capacitance, i.e., a maximum capacitance value and a minimum capacitance value, are formed on a semiconductor substrate, and a bias voltage with respect to each variable-capacitance diode is on/off switched by a switching element on the same semiconductor substrate, so as to change the equivalent electrostatic capacitance value.

According to this proposal, because switching elements are used to switch a plurality of variable-capacitance diodes, it is possible to achieve a wide range of variable capacitance, thereby enabling a wide variable frequency range. Additionally, because there is little change in the Q value with a change in electrostatic capacitance, it is possible to achieve a tuning circuit with some degree of stability.

However, because the plurality of variable-capacitance diodes formed on the semiconductor substrate make use of the depletion region of a PN junction, as noted above, a leakage current exists, so that it is not possible to increase the Q value of the tuning circuit beyond a certain amount, and difficult to achieve a stable tuning circuit. Additionally, in order to minimize the capacitance of the variable-capacitance diodes, it is necessary to apply a bias voltage that is somewhat high, and the generation of the bias voltage requires a negative power supply, this representing an important factor in increasing the number of components and the cost and the like of the tuning circuit. Also, although a plurality of PN junctions are formed on one semiconductor substrate to form variable-capacitance diodes, in order to prevent electrical interaction between adjacent variable-capacitance diodes and suppress variation of Q value, it is necessary to form an insulating region between each of the individual variable-capacitance diodes so as to electrically separate them, thereby increasing the number of semiconductor substrate manufacturing process steps, lowering the yield, and increasing the cost.

Accordingly, it is an object of the present invention to solve the above-noted problems by providing a tuning apparatus which uses a combination of semiconductor switches with capacitors having an extremely small leakage current, thereby providing superior stability and a wide frequency tuning range, making the tuning apparatus suitable for use in a compact radio-controlled timepiece, and by providing a radio-controlled timepiece using this tuning apparatus.

DISCLOSURE OF THE INVENTION

In order to achieve the above-noted objects, the present invention adopts a basic technical constitution as shown below.

A tuning circuit of the present invention basically has a semiconductor substrate, which has a plurality of semiconductor switches and a switch controlling means for controlling the opening and closing of the semiconductor switches, a plurality of capacitors, each of which is connected in series with a semiconductor switch of the plurality of semiconductor switches, and a coil connected to the plurality of capacitors, wherein the total electrostatic capacitance of the plurality of capacitors is varied by opening and closing the plurality of semiconductor switches so as to vary the tuned frequency of a tuning circuit formed by a plurality of the capacitances and the coil.

More specifically, the tuning circuit has semiconductor substrate, which is provided with a plurality of semiconductor switches, a plurality of first capacitors, each connected in series with each one of the plurality of semiconductor switches, respectively, a switch controlling means for controlling the opening and closing of the semiconductor switches and a plurality of coils each being connected in parallel to each one of said plurality of said first capacitors, wherein, in response to a received station selection command signal for a standard radio wave including time information, the switch controlling means, by separately controlling the opening and closing of the individual semiconductor switches connected to the plurality of first capacitors, varies the total electrostatic capacitance of the plurality of first capacitors, thereby varying the tuned frequency of the tuned circuit formed by the plurality of first capacitors and the coil.

Additionally, in the present invention, in order to broaden the tuning range or improve the efficiency of the tuning operation, it is preferable that, either on the semiconductor substrate or outside of the semiconductor substrate, a second capacitor having either a fixed capacitance or a variable capacitance be separately provided, connected to the coil in parallel with the group of first capacitors.

In adopting the above-noted configuration, it is desirable that the configuration be such that the second capacitor be subjected to control that is different from the control to which the first capacitors are subjected.

Additionally, in the present invention, when using a second capacitor, any appropriate means can be used to execute control of the second capacitor, one of these means being that of the switch controlling means performing control thereof via a semiconductor switch provided on the semiconductor substrate.

According to the tuning circuit of the present invention, because it is possible to open and close the semiconductor switches of a plurality of capacitors arbitrarily, it is possible to broaden the variable capacitance range, and as a result it is possible to achieve a wide tuned frequency range in the tuning circuit.

Therefore, in the case in which there are a plurality of received stations transmitting a standard radio wave including time information, it is easy to select the specific frequency of the radio wave transmitted by each of the received stations and to tune therewith.

A feature of the plurality of capacitors is that they are formed on the semiconductor substrate.

By doing this, it is possible to reduce the number of capacitor components, and to make the tuning circuit compact and simple to fabricate.

The plurality of capacitors formed on the semiconductor substrate are formed as capacitors by films, using an appropriate dielectric material such as an oxide film or a nitride film on the semiconductor substrate.

By doing this, because the leakage current of the capacitors is very small, it is possible to obtain a tuning circuit with superior stability.

One example of a semiconductor switch is a switch that is connected to a capacitor disposed outside the semiconductor substrate.

By doing this, it is possible to add a capacitor having large capacitance, which is difficult to form on a semiconductor substrate, thereby enabling a further broadening of the tuned frequency range, and achieving freedom in the range of selection of the connected coil.

The on resistance of the semiconductor switch is smaller than the impedance of the capacitor connected in series with the semiconductor switch.

Because of this, because it is possible to select the optimum on resistance of the semiconductor switch in accordance with the electrostatic capacitance of the connected capacitor, it is possible not only to make the semiconductor substrate compact, but also to achieve a high-sensitivity tuning apparatus.

A feature of the semiconductor switch is that its off resistance is larger than the impedance of the capacitor connected in series with the semiconductor switch.

Because of this, since it is possible to select the optimum off resistance of the semiconductor switch in accordance with the electrostatic capacitance of the connected capacitor, it is possible to achieve a high-sensitivity tuning apparatus.

Additionally, in the present invention, it is preferable that the resistance value of the resistor used in the amplifier circuit connected to the tuning circuit be made larger than the impedance of the tuning capacitor provided in the tuning circuit, thereby providing a further improvement in the gain of the antenna.

A feature of the plurality of capacitors is that the total value of the electrostatic capacitance of the plurality of capacitors is made 9600 pF or smaller.

By doing this, it is possible to make the size of the semiconductor substrate including thereon a plurality of capacitors, approximately 2 mm×1.6 mm, thereby improving the packaging efficiency.

The inductance of the coil is made 0.44 mH or higher.

By doing this, in the case in which the tuning circuit of the present invention is used as a tuning means in a radio-controlled timepiece, if the total value of the electrostatic capacitance of the plurality of capacitors is 9600 pF or lower, it is possible to tune to the highest frequency (77.5 kHz) of the standard radio waves.

The inductance of the coil is made 4000 mH or lower.

By doing this, in the case in which the tuning circuit of the present invention is used as a tuning means in a radio-controlled timepiece, if the parasitic capacitance of the semiconductor substrate or the mounting arrangement on the semiconductor substrate is approximately 4 pF, it is possible to tune to the lowest frequency (40 kHz) of the standard radio waves.

A radio-controlled timepiece according to the present invention has the above-noted tuning circuit, a control means for controlling the tuning circuit and for inputting a standard radio wave received by the tuning circuit and performing time correction, and a display means for displaying time information from the control means.

According to a radio-controlled timepiece of the present invention, not only is the tuned frequency variable range wide, but also it is possible to receive a standard radio wave with stable high sensitivity.

Additionally, the present invention has a metal exterior part made of a metallic material, which covers the tuning circuit, the controlling means, and the display means, providing mechanical protection thereof.

By doing this, it is possible to obtain a radio-controlled timepiece using a metal exterior part having the feel of high quality, which has resistance to damage and superior waterproofness.

A feature of the coil of the above-noted tuning circuit covered by the metal exterior part is that its inductance is made 20 mH or greater.

By doing this, it is possible to maintain the receiving sensitivity of the tuning circuit at or above a certain level, and to achieve a high-sensitivity radio-controlled timepiece even if it has a metal exterior part.

The configuration of the present invention is such that the opening and closing of the plurality of semiconductor switches of the tuning circuit is controlled, thereby varying the tuned frequency, so as to receive a plurality of standard radio waves.

By doing this, it is possible to receive a plurality of standard radio waves having different frequencies, making it possible to obtain a radio-controlled timepiece that accommodates various countries and regions.

Also, the present invention has a tuning storage means for storing tuning control information for the purpose of varying the tuned frequency of the tuning circuit.

By providing this, because it is possible to store information of a received standard radio wave in the tuning circuit, it is possible to selectively and arbitrarily receive a standard radio wave from a plurality of standard radio waves.

The above-noted tuning information storage means is provided internally in the tuning circuit.

By doing this, because it is possible to store information of received standard radio waves within the tuning circuit, it is possible to reduce the number of manufacturing process steps or the number of adjustment steps in a tuning circuit manufacturing process as well as to simplify the tuning circuit manufacturing process.

The tuning information storage means is either a pattern-cutting means, a fuse ROM, or a non-volatile memory.

By doing this, it is possible to select the optimum tuning information storage means in accordance with the specifications of the radio-controlled timepiece, and possible to reduce the cost, and simplify the manufacturing process.

SIMPLE DESCRIPTION OF THE DRAWINGS

FIG. 1 is a circuit diagram of a tuning circuit according to a first embodiment of the present invention.

FIG. 2 shows the equivalent circuit and an experimental circuit of the tuning circuit according to the first embodiment of the present invention, in which FIG. 2(*a*) is an equivalent circuit of the tuning circuit when the N transistor is in the on state, FIG. 2(b) is an equivalent circuit of the tuning circuit when the N transistor is in the off state, and FIG. 2(c) is an experimental circuit of the tuning circuit for the performing of verifying the influence of the on resistance and the off resistance of the N transistor.

FIG. 3 is an impedance ratio versus antenna gain characteristics graph of the tuning circuit according to the first embodiment of the present invention.

FIG. 4 is a partially expanded graph of the impedance ratio versus antenna gain characteristic of FIG. 3, in which FIG. 4(a) is a partially expanded graph of the part of graph at which the ratio is 0.01 or lower, for an antenna gain characteristic of 20 using a capacitor 10a of 1800 pF, and FIG. 4(b) is a partially expanded graph of the part of graph in which the ratio is 250 or higher, for an antenna gain characteristic of 20 using a capacitor 10a of 1800 pF.

FIG. 6 is a drawing describing the relationship between a radio-controlled timepiece into which a tuning circuit of the present invention is incorporated and a transmitting station that transmits a standard radio wave.

Figure 8:
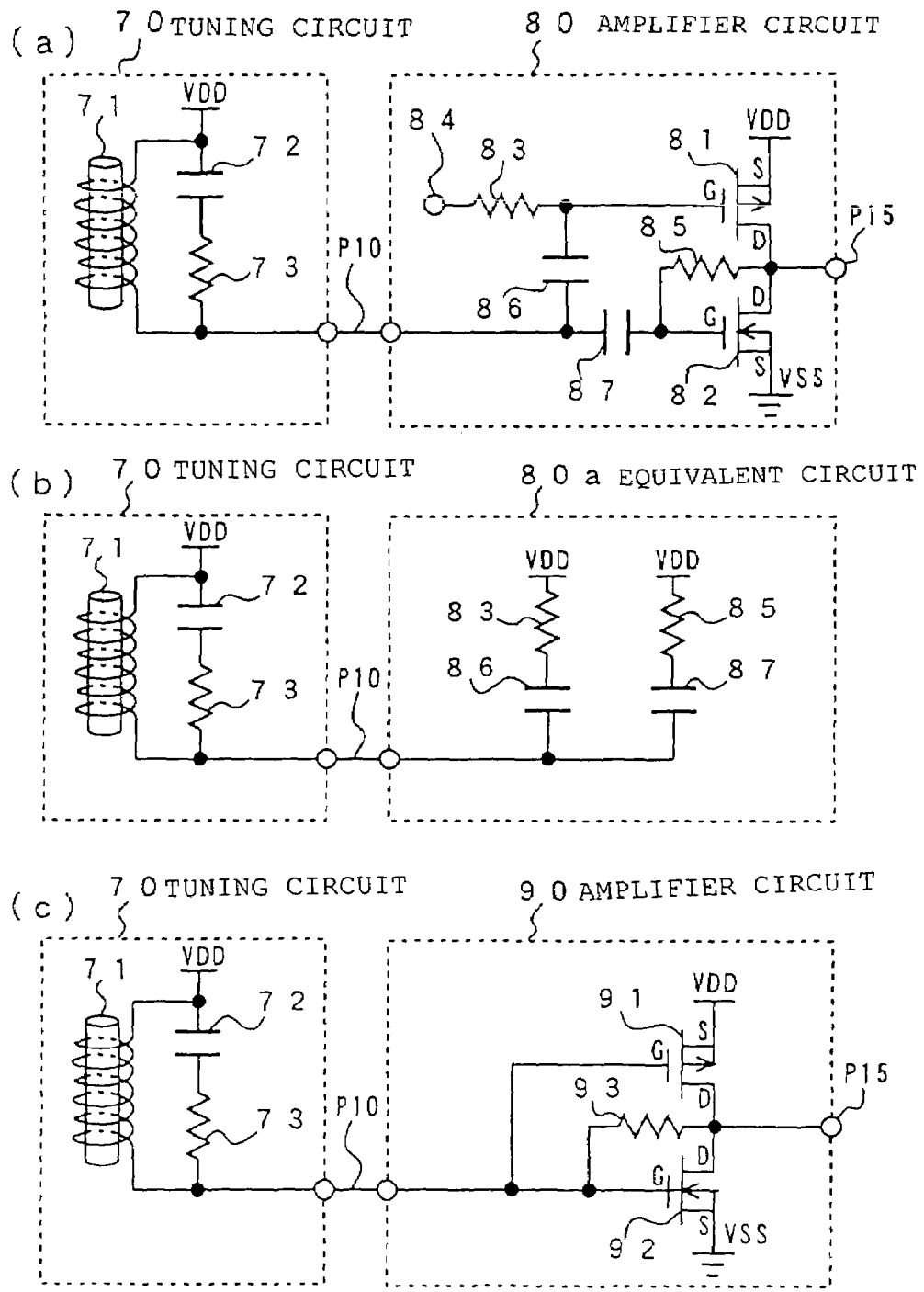

FIG. 8 is a simplified circuit diagram showing the relationship between the tuning circuit of the present invention and a receiving IC, in which FIG. 8(a) is a simplified circuit diagram of the tuning circuit according to the present invention and an amplifier circuit of a receiving IC, FIG. 8(b) is the equivalent circuit of FIG. 8(a), and FIG. 8(c) is another simplified circuit diagram of the tuning circuit of the present invention and an amplifier circuit of a receiving IC.

Figure 9:
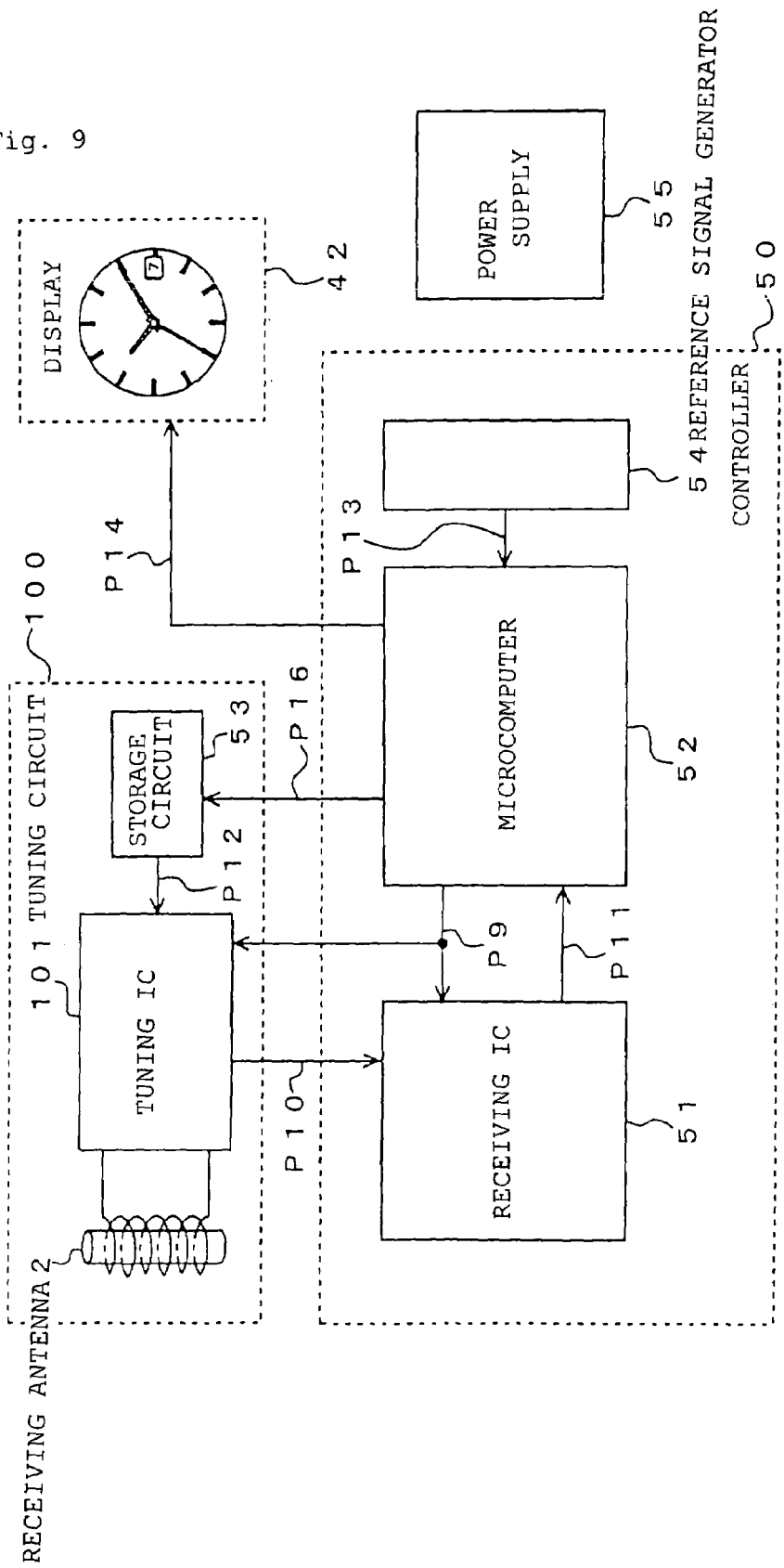

FIG. 9 is a circuit block diagram of a radio-controlled timepiece according to a fourth embodiment of the present invention.

FIG. 10 is a drawing showing the principle of the antenna tuning adjustment method in a radio-controlled timepiece according to the present invention, wherein FIG. 10(a) is a drawing showing the principle of a contact-type of antenna tuning adjustment method, and FIG. 10(b) is a drawing showing the principle of a non-contact type of antenna tuning adjustment method.

FIG. 11 is a drawing of antenna output characteristics obtained by the antenna tuning adjustment method of a radio-controlled timepiece according to the present invention.

FIG. 12 is a drawing showing a specific example of the configuration of a tuning circuit in a radio-controlled timepiece of the past.

FIG. 13 is a circuit diagram of a tuning circuit in another specific example of the present invention.

Figure 14:
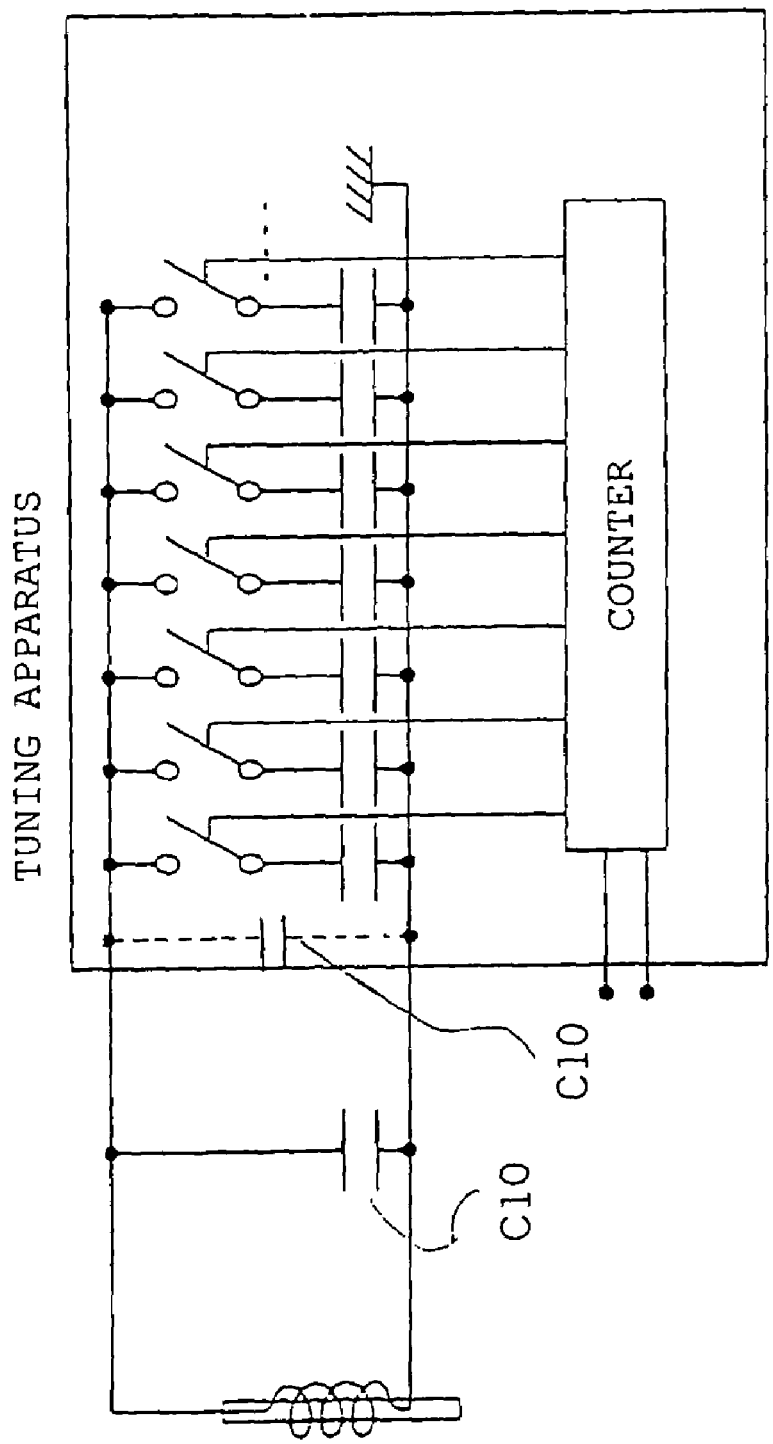

FIG. 14 is a circuit diagram of a tuning circuit in yet another specific example of the present invention.

Figure 15:
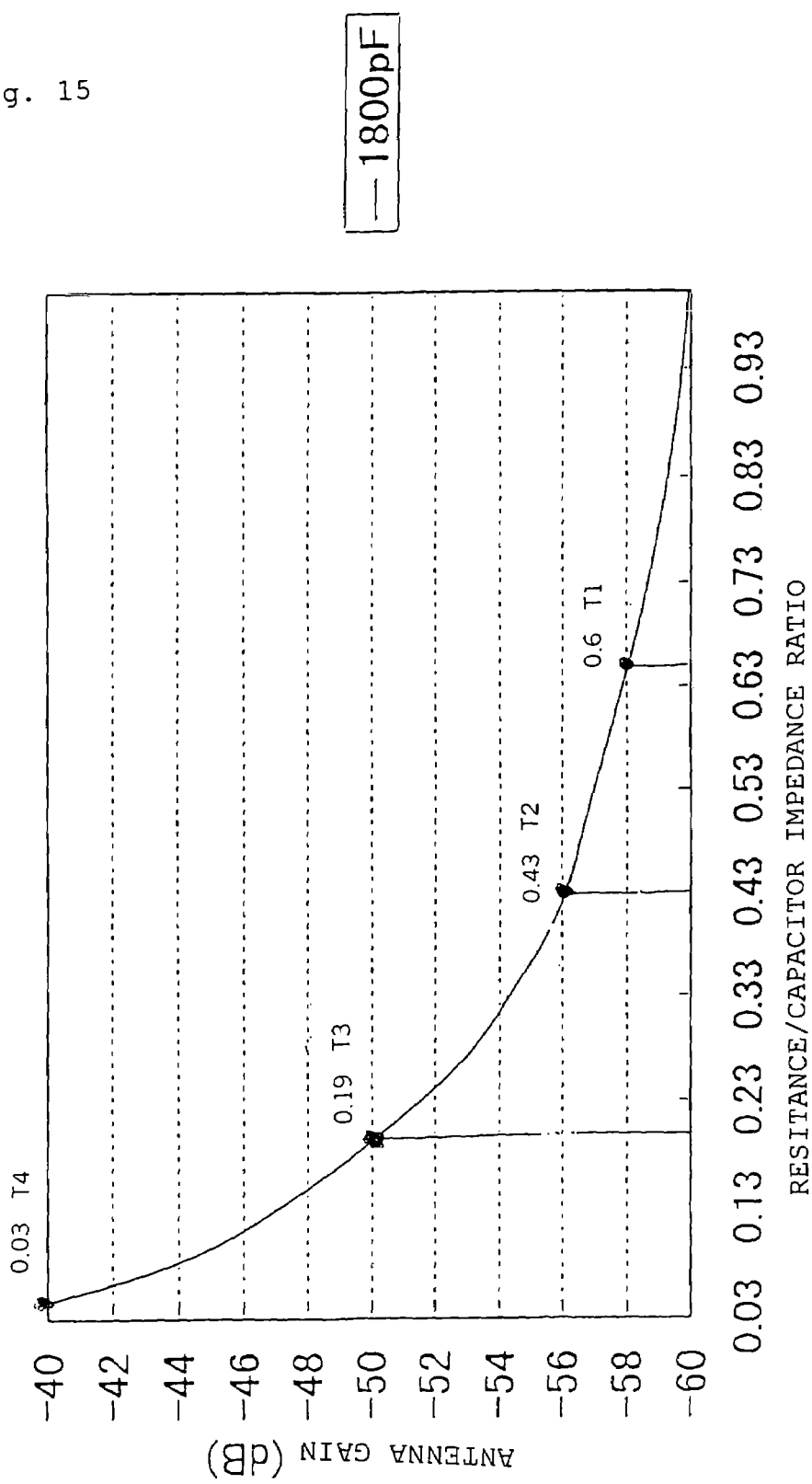
Figure 16:
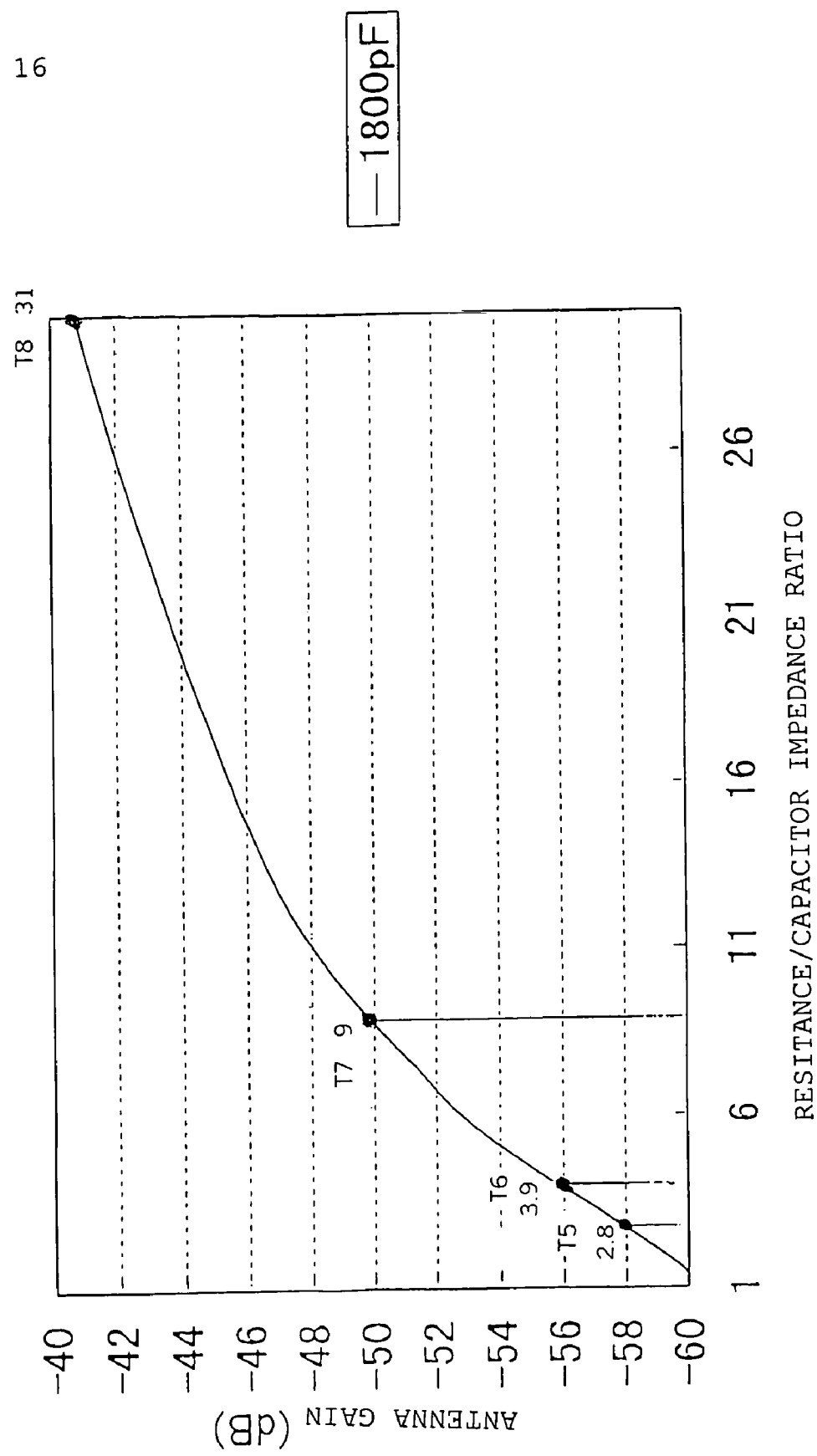

FIG. 15 and FIG. 16 are partially expanded impedance ratio versus antenna gain characteristics graphs in another specific example of the present invention.

FIG. 17 through FIG. 20 are drawings illustrating an example of a method for measuring the Q value.

Figure 21:
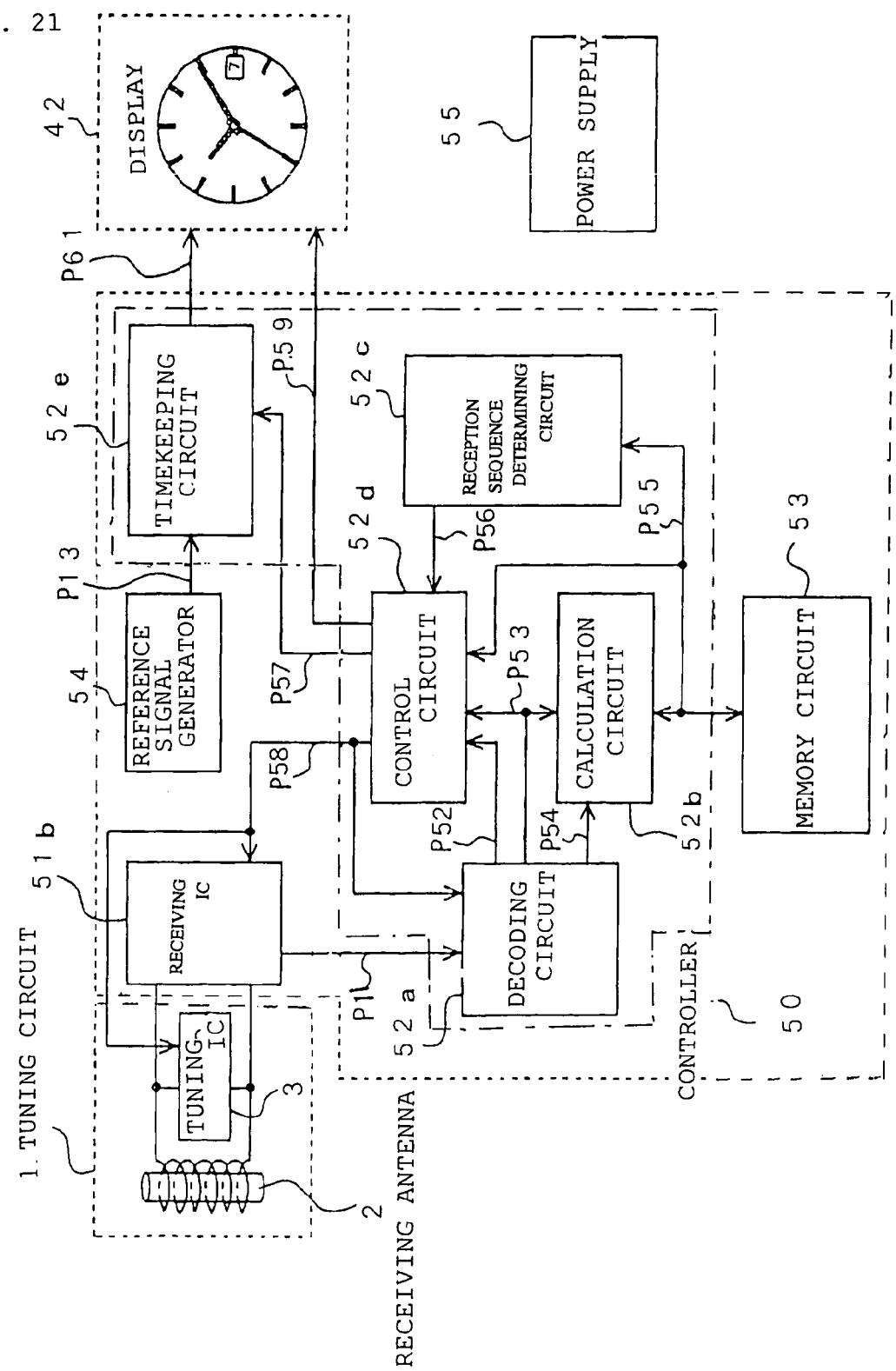

FIG. 21 and FIG. 22 are drawings describing an example of using a radio-controlled timepiece according to the present invention.

FIG. 23 is a circuit diagram showing an example of a circuit in which the tuning circuit of the present invention is connected to an amplifier circuit.

Figure 24:
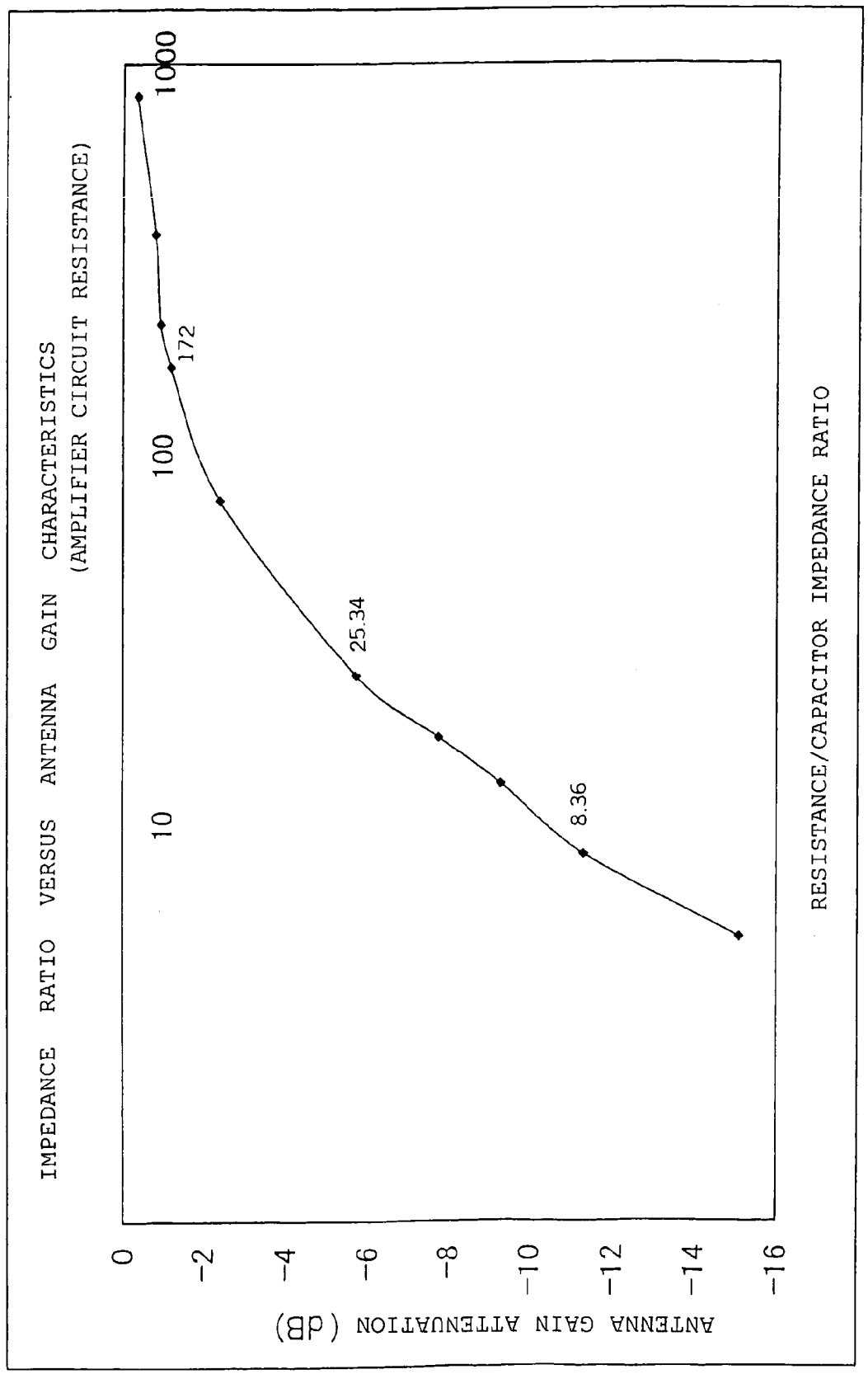

FIG. 24 is a graph showing the relationship of the ratio of the amplifier circuit resistance and the capacitor impedance in the tuning circuit as shown in FIG. 23 with the antenna gain attenuation.

DESCRIPTION OF THE PREFERRED
EMBODIMENTS OF THE PRESENT
INVENTION

Figure 1:
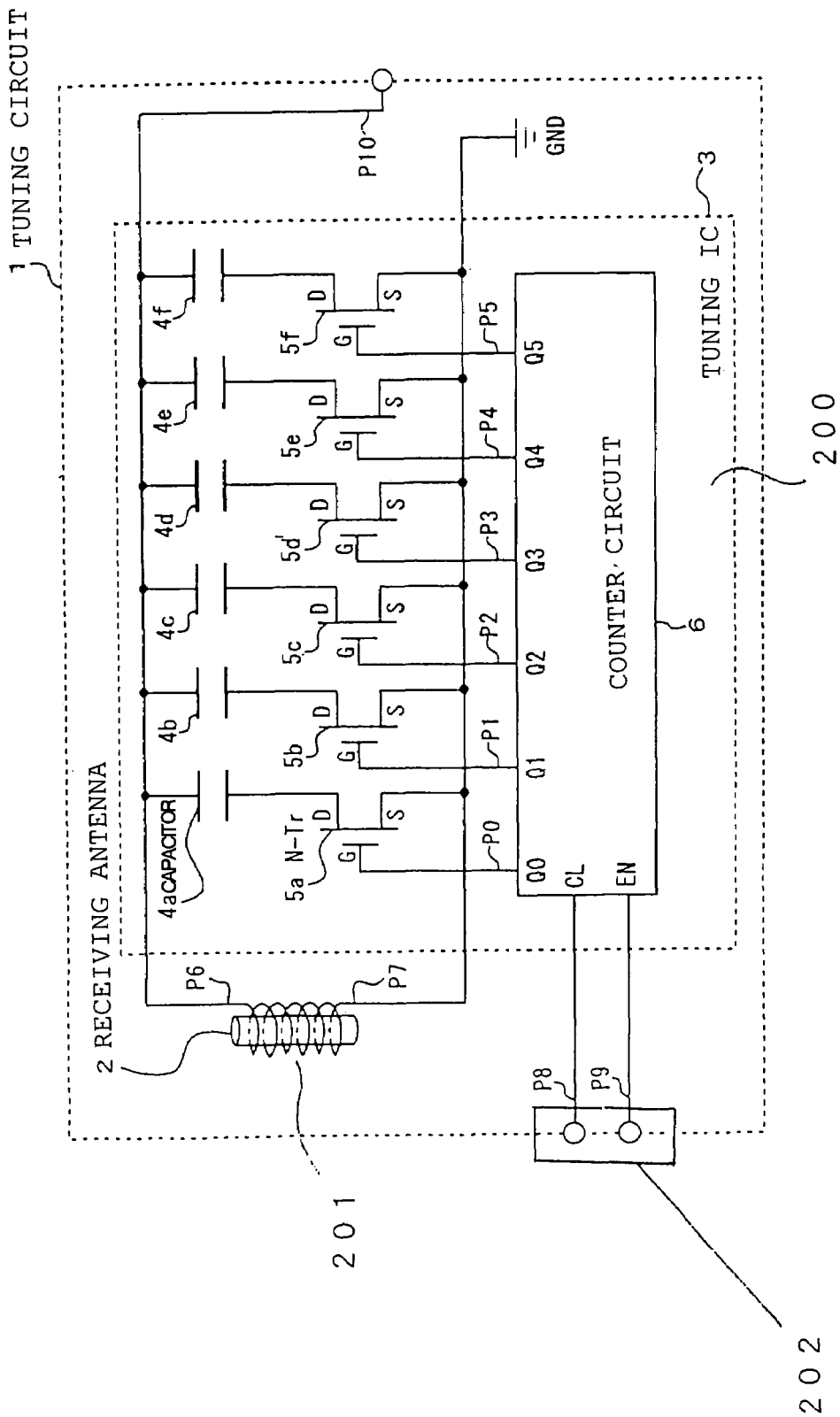

Embodiments of the present invention are described in detail below, based on the drawings. FIG. 1 is a block diagram showing an example of the configuration of a tuning circuit 1, which is a first embodiment of the present invention.

In the FIG. 1, a tuning circuit 1, for example, which being suitable for use in the receiver section of a radio-controlled timepiece is disclosed.

The configuration thereof in the drawing, has a semiconductor substrate 200, which is provided with a plurality of semiconductor switches 5, a plurality of first capacitors 4, which are each connected in series with the plurality of semiconductor switches 5, and a switch controlling means 6, which controls the opening and closing of the semiconductor switches 5, and a plurality of first coils 201 forming an antenna 2 and connected in parallel with each of the first capacitors 4, wherein, in response to a received station selection command signal for a standard radio wave including time information, the switch controlling means 6, by separately controlling the opening and closing of the individual semiconductor switches 5 connected to the plurality of first capacitors 4, varies the total electrostatic capacitance of the plurality of first capacitors 4, thereby varying the tuned frequency of the tuned circuit 1 formed by the plurality of first capacitors 4 and the coil 201.

As a more detailed description of the configuration of the tuning circuit 1 according to the first embodiment, in FIG. 1, 2 denotes a receiving antenna having a coil 201, which receives a radio wave, formed by a conductor wound around a substantially bar-shaped high-permeability material, the antenna outputs the antenna signals P6 and P7 which are induced by the received radio wave are output. 3 is a tuning IC formed in one chip and which includes the semiconductor substrate 200. 4a to 4f are a plurality of first capacitors formed within the tuning IC 3, these being formed as films made of a dielectric material, including an oxide film made of $SiO_2$ or the like or a nitride film made of $Si_3N_4$ or the like.

One terminal of the first capacitors 4a to 4f is connected in common to the antenna signal P6 of the receiving antenna 2.

5a through 5f are N-channel MOS transistors serving as a semiconductor switch 5 (referred hereinafter as N transistors) The drain terminals D of the N transistors 5a through 5f are connected in series with the other terminals of the first capacitors 4a through 4f, and the source terminals S of the N transistors 5a through 5f are connected in common to the antenna signal P7 of the receiving antenna 2 and also to GND, which is an electrical ground. Also, the electrical ground GND can be connected to the antenna terminal P6. 6 is a counter circuit serving as a switch controlling means, which has a clock terminal CL and an enable terminal EN, and which operates as a binary counter that counts pulses from the clock terminal CL, and which further has count terminals Q0 through Q5 as output terminals.

Additionally, P0 through P5 are count signals output from the count terminals Q0 through Q5 of the counter circuit 6, these being respectively connected to the gate terminals G of the N transistors 5a through 5f.

P8 is a clock signal connected to the clock terminal CL of the counter circuit 6, and P9 is an enable signal connected to the enable terminal EN of the counter circuit 6. P10 is a tuned signal that is the output of the tuning circuit 1, and is connected to the one terminal of the first capacitors 4a to 4f and to the antenna signal P6. In the case in which the antenna signal P6 is connected to GND, the tuning signal P10 is connected to the antenna signal P7.

Next, the operation of the tuning circuit 1 according to the first embodiment of the present invention is described below. In FIG. 1, during the time period in which the enable signal P9 is at logical 0, the counter circuit 6 maintains the reset state, and the count signals P0 through P5 output from the count terminals Q0 through Q5 are held at logical 0. As a result, because the potential on the gate terminals G of the N transistors 5a through 5f is held at zero volts, all of the N transistors 5a through 5f are in the off state, and the first capacitors 4a to 4f are isolated from the receiving antenna 2, so that a tuning circuit is not formed.

Next, when the enable signal P9 changes to logical 1, the reset state of the counter circuit 6 is cleared, and the standby state occurs, in which the pulses of the clock signal P8 are counted. In this case, when one pulse caused by the clock signal P8 is input to the clock terminal CL, the counter circuit 6 executes a counting operation, and the count signal P0 output at the count terminal Q0 changes to logical 1. In the same manner, if two pulses caused by the clock signal P8 are input to the clock terminal CL, the counter circuit 6 executes a counting operation and the count signal P1 which is output at the count terminal Q1 changes to logical 1.

In the same manner, if 63 pulses caused by the clock signal P8 are input to the clock terminal CL, the counter circuit 6 reaches the maximum count, and all of the count signals P0 through P5 become logical 1. In this case, because the count signals P0 through P5 are connected to the gate terminals G of the N transistors 5a through 5f, the N transistors 5a through 5f connected to the count signals P0 through P5 are on state. Also, the first capacitors 4a to 4f connected in series with each of the N transistors 5a through 5f which are in on state, are connected to the receiving antenna 2, the receiving antenna 2 and the first capacitors 4a to 4f connected to the receiving antenna 2 forming a parallel resonant circuit, which functions as the tuning circuit of the tuning apparatus 1.

As an example, consider the case in which a first capacitor 4a having an electrostatic capacitance of 12.5 pF, a first capacitor 4b having an electrostatic capacitance of 25 pF, a first capacitor 4c having an electrostatic capacitance of 50 pF, a first capacitor 4d having an electrostatic capacitance of 100 pF, a first capacitor 4e having an electrostatic capacitance of 200 pF, and a first capacitor 4f having an electrostatic capacitance of 400 pF are formed within the tuning IC 3. As a result, in response to the number of pulses of the clock signal P8, a tuning circuit will be formed by an electrostatic capacitance ranging from a minimum of 0 pF to a maximum of 787.5 pF, with a resolution of 12.5 pF being connected in parallel with the receiving antenna 2.

In reality, however, because of parasitic capacitances and floating capacitances within the tuning IC 3 due to interconnects and the like, an electrostatic capacitance ranging from several to several tens of pF will be added to the above-noted electrostatic capacitance.

The tuned frequency (that is, the resonant frequency) F of the tuning circuit formed by the receiving antenna 2 and the first capacitors 4a through 4f connected via the N transistors 5a through 5f to the receiving antenna 2, with the inductance of the receiving antenna 2 as L, if the total electrostatic capacitance of the connected capacitors 4a through 4f as C, is given as follows.

$$F = 1/2\pi\sqrt{LC} \quad \text{(Equation 1)}$$

Therefore, in accordance with Equation 1, it can be understood that when the total electrostatic capacitance of the capacitors 4a through 4f is varied, the tuned frequency F varies. At the tuned frequency F, the impedance of the tuning circuit formed by the receiving antenna 2 and the capacitors 4a through 4f is maximum, and when a received radio wave having a frequency equal to the tuned frequency F reaches the receiving antenna 2, a received signal having a frequency equivalent to the tuned frequency F will be induced between the antenna signals P6 and P7, and is output as the tuned signal P10.

That is, because in the tuning circuit 1 of the present invention the first capacitors 4a through 4f are connected to the receiving antenna 2 in response to the number of pulses of the clock signal P8, it is possible to arbitrarily vary the tuned frequency F.

As a result, it is possible, from radio waves of various frequencies reaching the receiving antenna 2, to select and receive a specific radio wave selected with the tuned frequency F. In this embodiment, although the plurality of first capacitors are the first capacitors 4a through 4f, i.e., 6 capacitors, and there are also 6 N transistors 5a through 5f, which open and close the connections to the first capacitors 4a through 4f, there is no restriction to these numbers, and it is also possible to increase the number of first capacitors and N transistors if necessary to achieve a wider tuning range or, alternatively, to decrease the number of first capacitors and N transistors if not such a wide tuning range is required.

It is further possible to arbitrarily establish the electrostatic capacitances of the first capacitors 4a through 4f in accordance with the required performance.

Specifically, because the tuning circuit 1 in the present invention, by using a combination of a plurality of capacitors having one and the same capacitance or mutually different capacitances, easily enables the appropriate variation of the total electrostatic capacitance in the tuning circuit 1, it is possible by arbitrarily varying the tuned frequency of the tuning circuit 1, to freely set the frequency of the radio wave being received.

As a result, in the case of movement of a user to an arbitrary country or region, and receiving of a standard radio wave including time information received in that country or region, when correction of the time information of the radio-controlled timepiece is performed, by responding to an appropriate selection command signal and performing a operation driving the controlling means 6, it is possible to adjust the tuned frequency within the tuning circuit to the frequency of a standard radio wave that can be received, thus enabling easy reception of the desired standard radio wave.

In the present invention, because a plurality of first capacitors are used, by selectively combining these capacitors, it is possible to make settings to a plurality of tuned frequencies within the tuning circuit 1, thereby enabling accommodation to a plurality of types of standard radio waves.

Specifically, for example, in a case in which it is unclear what the frequency is of a standard radio wave from a prescribed received station, an appropriate external operating means 202 is provided, which is caused to function as a received station selection means, the enable signal P9 and clock signal P8, which control the drive of the controlling means 6, from the external operating means 202 are input as received station selection command signals either automatically or by a manual operation, and selection of a combination of the first capacitors 4 is made in response to the clock signal and is executed, so as to determine the total electrostatic capacitance at which a resonance output with is the output P10 from the tuning circuit 1 is maximum, that condition being set, or alternatively a plurality of selection states for combinations of received station frequencies and the first capacitors 4, are stored beforehand in an appropriate storage means, so that in the case in which the frequency of a standard radio wave in a country or region of reception is known beforehand, by inputting a code number that selects the prescribed frequency to the controlling means 6 from the external operating means 202, the combination conditions for selecting a first capacitors 4 corresponding to the prescribed frequency, which were stored in the storage means, can be read out, so as to execute a combination selection operation for the first capacitors 4.

The following is a brief description of the difference between the method of tuning according to the present invention and the method of tuning used in the past when receiving a standard radio wave.

Specifically, with the method of the past, as shown in FIG. 12, in the case of a timepiece capable of receiving a 40 kHz and a 60 kHz radio wave in Japan and a 77.5 kHz radio wave in Germany, in the tuning system of the past the connections shown in the system of the past are made, so as to pre-connect C1, C4, and C7, and combination switching of C2, C3, C4, and C8 is done so as to adjust to the respective resonant frequencies.

For example, if tuning is done using an antenna having an L1 value of 2 mH and commercially available capacitors with a tolerance of ±5%, and with an antenna Q value of 100, and tuning is done over the range between points of 3 dB attenuation from the maximum gain, C1 is 1800 pF, C4 is 1200 pF, and C7 is 3900 pF, the 77.5 kHz tuning range is ±387.5 Hz, the 60 kHz tuning range is ±300 Hz, and the 40 kHz tuning range is ±200 Hz.

In the case of tuning to 77.5 kHz, switches SW1 and SW2 are set to off, and the resonant frequency is determined and compensated in the condition with C1 connected.

In this case, although the largest capacitor C2 is 390 pF, since because of the tolerance of the capacitors the frequency might fall out of the above-noted range, in order to determine the resonant frequency once again, the resonant frequency is determined and compensation and adjustment are performed using this result.

When this is done, the largest capacitance, C3, is 33 pF.

Subsequent to the above, the resonant frequency is measured as a verification of the resonant frequency.

Next, in the case of tuning to 60 kHz, switch SW1 is set to on and switch SW2 is set to off, and the resonant frequency is determined and compensated in the condition in which C1, C2, C3, and C4 are connected.

In this case, although the largest capacitor C5 is 220 pF, since because of the tolerance of the capacitors, the frequency might fall out of the above-noted range, in order to determine the resonant frequency once again, the resonant frequency is determined and compensation and adjustment are performed using this result.

Subsequent to the above, the resonant frequency is measured as a verification of the resonant frequency.

At this time, the largest capacitance, C6, is 33 pF.

Next, in the case of tuning to 40 kHz, switch SW1 is set to on and switch SW2 is set to off, and the resonant frequency is determined and compensated in the condition in which C1, C2, C3, C4, C5, and C6 are connected.

In this case, the largest capacitance, C8, is 680 pF.

Subsequent to the above, the resonant frequency is measured as a verification of the resonant frequency.

As described above, 8 tuning capacitors are required to tune to 3 stations, and it is necessary to determine the resonant frequency as many as 8 times, and also necessary to solder capacitors for the purpose of determining the resonant frequency.

In contrast to the above, in the present invention, as noted above, if for example 8 capacitors and semiconductor switches 5 are built into an IC circuit beforehand, as shown in FIG. 1, it is possible to easily vary all the electrostatic capacitances in the tuning circuit by merely performing appropriate switch control, thus providing the advantage that soldering is not required for each individual connection, and also the advantage of simplifying the manufacturing process and reducing size.

Next, as a result of an investigation made by the inventors performed an investigation with regard to a constitution with which, in the tuning circuit 1 of the present invention, there is a further improvement in receiving performance, it was learned that by maintaining the relationship between the resistance value of the semiconductor switch 5 and the impedance of the first capacitor at a suitable condition, it is possible to improve the receiving performance, thereby enabling the achievement of a high level of receiving performance, even in the case in which the radio wave receiving circuit that includes the tuning circuit is housed within a metal exterior part.

Specifically, it was learned that, in the tuning circuit 1 of the present invention, it is desirable that the on resistance of each of the semiconductor switches 5 be set so as to be smaller than the impedance of each of the capacitors 4 that are connected in series with the semiconductor switches 5, and also desirable that the off resistance of each of the semiconductor switches be greater than the impedance of the capacitors 4 connected in series with the semiconductor switches 5.

What follows below is a verification of what the influence is of the on resistance and the off resistance of the N transistors 5a through 5f serving as the semiconductor switches 5 shown in FIG. 1, and approximately what are the preferred values for the on resistance and the off resistance of the N transistors 5a through 5f, with references being made to FIG. 2 through FIG. 4.

FIG. 2 shows an equivalent circuit of the tuning circuit 1 forming the tuning apparatus shown in FIG. 1, and an experimental circuit, FIG. 2(a) showing the equivalent circuit in the condition in which the N transistors 5a through 5f of the tuning circuit 1 are in the on state, FIG. 2(b) showing the equivalent circuit in the state in which the N transistors 5a through 5f are in the off state.

In FIG. 2(a), 4 denotes a capacitor representing the first capacitors 4a through 4f, and 5 is an N transistor representing the N transistors 5a through 5f. When a voltage Vg is applied to the gate terminal G of the N transistor 5, the N transistor 5 turns on. The equivalent circuit in this state is as shown by the arrow A. In the equivalent circuit of FIG. 2(a), 5 on indicates the on resistance of the N transistor 5, 5s indicates a switch showing the on operation of the N transistor 5, and 4 indicates a capacitor connected in series with the N transistor 5.

That is, because N transistor 5 is a semiconductor switch, even when it is in the on state, there exists some amount of on resistance, 5on.

Next, in FIG. 2(b), the capacitor 4 is a capacitor representing the first capacitors 4a through 4f, and N transistor 5 represents the N transistors 5a through 5f. Because the gate terminal G of the N transistor 5 is at the same potential as the source terminal, the N transistor 5 is off. The equivalent circuit at that time is indicated by the arrow B. In this case, in the equivalent circuit of FIG. 2(b), 5 off represents the off resistance of the N transistor 5, 5s indicates a switching showing the off operation of the N transistor 5, and 4 is a capacitor representing a capacitor connector in series with the N transistor 5. That is, because the N transistor 5 is a semiconductor switch, even if it is in the off state, its resistance value is not infinite, there existing some finite off resistance, 5 off.

In this manner, the N transistor 5, i.e., the semiconductor switch, has an on resistance 5 on and an off resistance 5 off, and it is not possible to ignore the influence of the on resistance 5 on and the off resistance 5 off on the tuning circuit 1. If the size of the N transistor 5 is made infinitely large, it is possible that the on resistance 5 on will take on a value that is almost nearly zero. However, if the transistor size is made large, the size of the tuning IC chip 3 that incorporates within it the N transistors 5 becomes large, and there are the problems of increased cost and achievement of a compact tuning apparatus. Also, if the size of the N transistor 5 is made large, there is an increase in the floating capacitance and parasitic capacitance, leading to the problem of a narrowing of the variable range of the tuned frequency.

If the threshold voltage for turning the N transistor 5 on is made high, it is possible to achieve quite a high off resistance 5 off. However, in order to build the tuning circuit into a battery-powered device such as a radio-controlled timepiece, low-voltage drive is essential, so that this approach is not advantageous. Also, if the threshold value is made high, the result is an increase in the on resistance, leading to the problem of this counter-effect. Because of this situation, it is necessary to make a preferable selection of the on resistance and the off resistance of the N transistor 5, so that an adverse effect on the tuning circuit is minimized and also so that there is no increase in the size of the chip of the tuning IC 3 and so that low-voltage drive is possible.

The applicant, from the above-noted standpoint, conducted and experiment to investigate the effect of the on resistance and the off resistance of the N transistor 5 operating as a semiconductor switch 5, and to verify the optimal values thereof, this being described below.

FIG. 2(c) is an experimental circuit for the purpose of verifying the optimal values for the on resistance and the off resistance of the N transistor, which shows a tuning circuit having a configuration similar to a tuning circuit 1 such as in FIG. 1, with a receiving antenna 2, a plurality of capacitors 4a through 4f, and N transistors 5a through 5f.

In FIG. 2(c), 2 is a receiving antenna equivalent to that shown in FIG. 1. 10a through 10d are chip-type or discrete type capacitors having little leakage current, these being provided so as to have different electrostatic capacitances, one terminal of which is connected in common to one terminal of the receiving antenna 2.

11a through 11d are switches corresponding to the N transistors 5a through 5f of FIG. 1, these having an extremely small on resistance. 12 is a variable resistor corresponding to the on resistance or the off resistance of the N transistors 5a through 5f in FIG. 1, which provides a wide range of variable resistance.

The variable resistor 12 can be arbitrarily disposed between the capacitors 10a through 10d and the switches 11a through 11d, and in the case of FIG. 2(c) it is disposed between the capacitor 10a and the switch 11a. The electrostatic capacitance of the capacitor 10a is 1800 pF, the electrostatic capacitance of the capacitor 10b is 1000 pF, the electrostatic capacitance of capacitor 10c is 560 pF, and the electrostatic capacitance of the capacitor 10d is 100 pF.

Additionally, 13 is an excitation coil, which is disposed in the vicinity of the receiving antenna 2 and generates an AC magnetic field 14 corresponding to the received radio wave. 15 is an AC signal generator, which supplies an AC signal in the region of 40 kHz for the purpose of generating the AC magnetic field 14 in the excitation coil 13. The receiving antenna 2 is adjusted in inductance so that, with the total electrostatic capacitance of the capacitors 10a through 10d, the resonant frequency is approximately 40 kHz. 16 is a high-input-impedance AC voltmeter connected across the terminals of the receiving antenna 2, which measures the AC signal induced it the receiving antenna 2.

Next, the experimental method will be explained. In FIG. 2(c), the resistance value of the variable resistor 12 is first made sufficiently small, and all of the switches 11a through 11d are closed. Next, the AC signal generator 15 is used to supply an AC signal to the excitation coil 13 and generate the AC magnetic field 14.

By doing this, an AC current is induced in the receiving antenna 2 by the AC magnetic field 14, and it is possible to measure the induced AC current using the AC voltmeter 16.

At this point, the frequency having the largest measured value measured by the AC voltmeter 16 obtained by varying the frequency of the AC signal generator 15, is the tuned frequency in accordance with a total electrostatic capacitance of the receiving antenna 2 and the capacitance of capacitors 10a through 10d, and value on the AC voltmeter 16 at this frequency are recorded.

Next, after increasing the value of the variable resistor 12 slightly, the frequency of the AC signal source 15 is fine adjusted and the value at which the measured value on the AC voltmeter 16 is maximum is recorded, similar to the above.

In the same manner, the task of recording the value on the AC voltmeter 16 is repeated as the resistance value of the variable resistor 12 is successively made larger, measurements being made until the ratio between the resistance value of variable resistor 12 and the impedance of the capacitor 10a with respect to an AC signal is 1, after which the resistance value of the variable resistor 12 is increased until this ratio is 10 times, 100 times, and 1000 times, the measured value on the AC voltmeter 16 being recorded each time.

Figure 3:
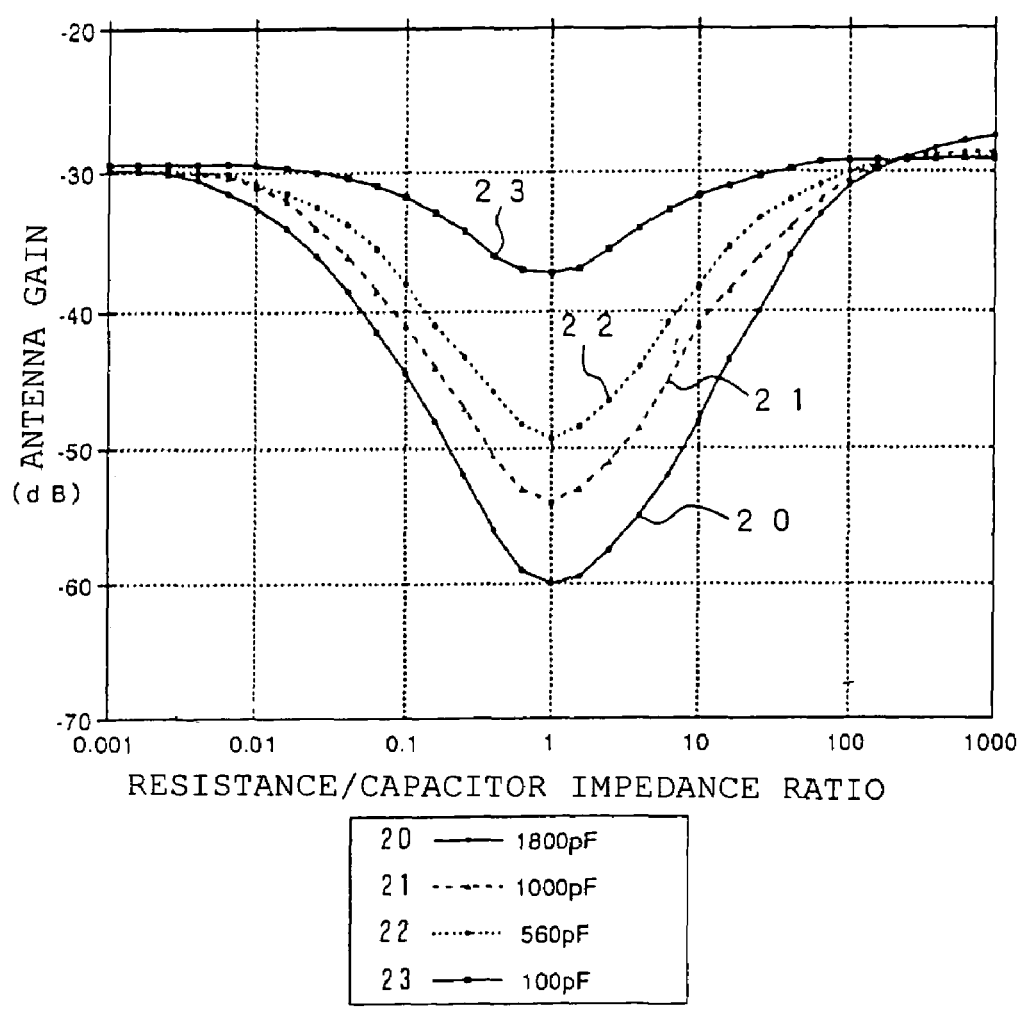

FIG. 3 is a graphic summary of the measurement results from the above, in the form of a graph of the antenna gain characteristics versus the impedance ratio. In FIG. 3, the X axis is the ratio of the resistance value of the variable resistor 12 to the impedance of the capacitors 10a to 10d relative to frequency, and the Y axis is the antenna gain, which is the decibel display on the AC voltmeter 16, expressed relative to the reference of 0 dB, which is the output voltage from the AC signal source 15.

In FIG. 3, 20 is the antenna gain characteristic when the variable resistor 12 is connected in series with the capacitor 10a with 1800 pF. In this case, in the region in which the resistance/capacitor impedance ratio is very small such as around 0.001 (that is, in a region in which the resistance value of the variable resistor 12 is very small), the antenna gain is approximately −30 dB, indicating a relative high gain. However, as illustrated, when the resistance/capacitor impedance ratio is made larger, there is a sharp decrease in the antenna gain, and in the region in which the resistance/capacitor impedance ration is 1, the antenna gain drops to the lowest level, so as to reach −60 dB.

Additionally, when the resistance/capacitor impedance ratio is increased so that it exceeds 1, the antenna gain again rises, and when the resistance/capacitor impedance ratio is in the region above 100 (that is, in a region in which the resistance value of the variable resistor 12 is very large), the antenna gain again rises to approximately −30 dB. In the same manner, 21 shows the antenna gain characteristics when the variable resistor 12 is connected in series with capacitor 10b with the 1000 pF. In this case, the variable resistor 12 which had been connected to the capacitor 10a is removed, and the capacitor 10a is connected directly to the switch 11a.

That is, in FIG. 3 the region in which the resistance/capacitor impedance ratio is 1 or less indicates the region of the on resistance of the semiconductor switch 5, and in contrast to this the region in which the resistance/capacitor impedance ratio is 1 or greater indicates the region of the off resistance of the semiconductor switch 5.

In this case, when the antenna gain characteristics 21 is received, nit is understood that in the region in which the resistance/capacitor impedance ratio is 1, the attenuation is approximately −54 dB, which compared with the above-noted antenna gain characteristics 20, is a slight attenuation, but that changing the capacitor electrostatic capacitance does not create a great change in the antenna gain characteristics. In the same manner, the antenna gain characteristics 22 are the antenna gain characteristics when the variable resistor 12 is connected in series with the 560 pF capacitor 10c, and the antenna gain characteristics 23 are the antenna gain characteristics when the variable resistor 12 is connected in series with the 100 pF capacitor 10d. Although the amounts of attenuation in these antenna gain characteristics differ, they are in agreement in a tendency of the antenna gain characteristic since the antenna gain is the most reduced in the region in which the resistance/capacitor impedance ratio is 1.

Next, the reason why the antenna gain is reduced the most in the vicinity in which the ratio between the variable resistor 12 and the capacitor impedance is 1 is described below.

In FIG. 2(c), because in this region the variable resistor 12 is small enough relative to the impedance of the capacitor 10a to be ignored, since no effect caused by the variable resistor 12 exists, the receiving antenna 2 and the capacitors 10a through 10d operate as an LC parallel resonant circuit, and because the loss is small, the antenna gain is large (for example, in the region in which the ratio is 0.01 or smaller). However, when the resistance value of the variable resistor 12 becomes large, because the variable resistor 12 acts as a loss in the LC parallel resonant circuit, the Q value becomes small, resulting in a reduction in the antenna gain.

In the region in which the ratio between the variable resistor 12 and the impedance of the capacitor 10a is 1, because the influence of the variable resistor 12 is maximum relative to the capacitor 10a, the loss of the LC parallel resonant circuit is also maximum, resulting in the most reduction in the antenna gain. However, when the ratio between the variable resistor 12 and the impedance of the capacitor 10a exceeds 1, the variable resistor 12 impedes the operation of the capacitor 10a as a capacitor, and when the variable resistor 12 becomes sufficiently larger than the impedance of the capacitor 10a (for example, in the region in which the ratio is 100 or greater), the capacitor 10a is equivalently cut off from the LC parallel resonant circuit, so that the capacitance of the LC parallel resonant circuit is the total electrostatic capacitance of only the 3 capacitors such as the capacitors 10b through 10d. As a result, although the resonant frequency is shifted slightly, the loss due to the variable resistor 12 is reduced, and the antenna gain again becomes high.

Next, a verification will be presented of the preferable values of on resistance 5 on and off resistance 5 off for the N transistor 5 as shown in FIGS. 2(a) and 2(b), based on the results shown in FIG. 3.

At this point, high sensitivity and high selectivity can be said to be important elements of the electrical characteristics of the tuning apparatus receiving a radio wave. From this standpoint, it is preferable that the antenna gain of the tuning apparatus be as high as possible, and that the loss of the tuning circuit be small and the Q thereof be high.

Thus, as can be understood from the antenna gain characteristics of FIG. 3, both the value of the on resistance 5 on and the value of the off resistance 5 off of the N transistor 5 must be established so that the ratio between the on resistance or the off resistance and the impedance of the capacitor is not in the region of 1. That is, it is preferable that the value of the on resistance 5 on of the N transistor 5 serving as the semiconductor switch be smaller than the impedance of the capacitors 4 connected in series with the N transistor 5 (that is, for a ratio of 1 or less). In the same manner, it is preferable that the value of the off resistance 5 off of the N transistor 5 be larger than the impedance of the capacitors 4 connected in series with the N transistor 5 (that is, for a ratio of 1 or greater).

Next, a detailed verification is performed for more preferable values of the on resistance 5 on and the off resistance 5 off of the N transistor 5. FIG. 4 is a partially expanded graph of the impedance ratio versus antenna gain characteristics of FIG. 3, in which FIG. 4(a) is an partially expanded graph of the antenna gain characteristics 20 in the case in which the resistance/capacitor impedance ratio is 0.01 or lower, using a 1800 pF capacitor 10a, and FIG. 4(b) is an partially expanded graph of the antenna gain characteristics 20 in the case in which the resistance/capacitor impedance ratio is 250 or higher, using a 1800 pF capacitor 10a.

FIG. 15 is a partially expanded graph of the antenna gain characteristics 20 when using a 1800 pF capacitor 10a, over the range of resistance/capacitor impedance ratio from 0.03 to 1, and FIG. 16 is, in the same manner, a partially expanded graph of the antenna gain characteristics 20 when using a 1800 pF capacitor 10a, over the range of resistance/capacitor impedance ratio from 1 to 31.

In FIG. 15, the antenna gain when the resistance/capacitor impedance ratio is approximately 1 is 60 dB, this being the ratio 1 when the variable resistor 12 and the impedance of the capacitor are equal (that is, with the ideal on resistance). Therefore, because taking the antenna gain of −60 dB to be the worst antenna gain, the resistance/capacitor impedance ratio at the −58 dB point, at which the gain is increased by 2 dB is approximately 0.6 from FIG. 15 (point T1), it is preferable that the impedance ratio between the on resistance 5 on and the impedance of the capacitor 4 be 0.6 or smaller.

Also, the resistance/capacitor impedance ratio at the −56 dB point, at which the gain is increased by 4 dB from the worst antenna gain of −60 dB, is approximately 0.43 (point T2), and it is preferable that the impedance ratio between the on resistance 5 on and the impedance of the capacitor 4 be, from FIG. 4(a), 0.43 or smaller.

Also, the resistance/capacitor impedance ratio at the −50 dB point, at which the gain is increased by 10 dB from the worst antenna gain of −60 dB, is approximately 0.19 (point T3), and it is preferable that the impedance ratio between the on resistance 5 on and the impedance of the capacitor 4 be, from FIG. 4(a), 0.19 or smaller.

Also, the resistance/capacitor impedance ratio at the −40 dB point, at which the gain is increased by 20 dB from the worst antenna gain of −60 dB, is approximately 0.03 (point T4), and it is preferable that the impedance ratio between the on resistance 5 on and the impedance of the capacitor 4 be, from FIG. 4(a), 0.03 or smaller.

In FIG. 4(a), the antenna gain at a resistance/capacitor impedance ratio of 0.001 is −29.5 dB, and the ratio of 0.001 is when the variable resistor 12 is at a value substantially close to zero (that is, the ideal on resistance). Therefore, taking the antenna gain of −29.5 dB to be the ideal antenna gain (arrow C), because the resistance/capacitor impedance ratio at the −32.5 dB, which is 3 dB attenuated from the ideal antenna gain of −29.5 dB is, from FIG. 4(a), approximately 0.0084 (point N3), it is preferable that the ratio between the on resistance 5 on and the impedance of the capacitor 4 be 0.0084 or lower.

Also, because the resistance/capacitor impedance ratio at −31.5 dB, which is 2 dB attenuated from the ideal antenna gain of −29.5 dB is approximately 0.0057 (point N2), it is further preferable that the ratio between the on resistance 5 on and the impedance of the capacitor 4 be 0.0057 or lower. Furthermore, because the resistance/capacitor impedance ratio at −30.5 dB, which is just 1 dB attenuated from the ideal antenna gain of −29.5 dB is approximately 0.003 (point N1), it is more preferable that the ratio between the on resistance 5 on and the impedance of the capacitor 4 be 0.003 or lower.

Next, in FIG. 16 the antenna gain at resistance/capacitor impedance ratio of approximately 1 is 60 dB, this being the case in which the resistance of the variable resistor 12 and the capacitor impedance are equal (that is, the least ideal on resistance). Therefore, taking −60 dB as the worst antenna gain, because the resistance/capacitor impedance ratio at −58 dB, which is 2 dB increased from the worst antenna gain, is from FIG. 16 approximately 2.8 (point T5), it is preferable that the ratio between the on resistance 5 on and the impedance of the capacitor 4 be 2.8 or greater.

Because the resistance/capacitor impedance ratio at −56 dB, which is increased by 4 dB from the worst antenna gain, that is −60 dB, is approximately 3.9 (point T6), it is further preferable that the ratio of the on resistance 5 on to the impedance of the capacitor 4 be, from FIG. 4(a), 3.9 or greater.

Because the resistance/capacitor impedance ratio at −50 dB, which is increased by 10 dB from the worst antenna gain of −60 dB, is approximately 9 (point T7), it is further preferable that the ratio of the on resistance 5 on to the capacitor impedance be, from FIG. 4(a), 9 or greater.

Because the resistance/capacitor impedance ratio at −40 dB, which is increased by 20 dB from the worst antenna gain of −60 dB, is approximately 31 (point T8), it is further preferable that the ratio of the on resistance 5 on to the impedance of the capacitor 4 be, from FIG. 4(a), 31 or greater.

In FIG. 4(b), because the antenna gain of −26.2 dB is outside the range of the graph, this is the antenna gain when the value of the variable resistor 12 is close to being infinity (that is, the ideal off resistance). Therefore, taking −26.2 dB as the ideal antenna gain (arrow D), because the resistance/capacitor impedance ratio at −29.2 dB, which is reduced by 3 dB from the ideal antenna gain, is, from FIG. 4 (b) approximately 300 (point F3), it is preferable that the ratio between the off resistance 5 off and the impedance of the capacitor 4 be 300 or greater.

Because the resistance/capacitor impedance ratio at −28.2 dB, which is reduced by 2 dB from the ideal antenna gain of 26.2 dB, is, from FIG. 4(b) approximately 450 (point F2), it is preferable that the ratio between the off resistance 5 off and the impedance of the capacitor 4 be 450 or greater. Further, because the resistance/capacitor impedance ratio at −27.2 dB, which is reduced by just 1 dB from the ideal antenna gain of −26.2 dB, is, from FIG. 4(b) approximately 900 (point F1), it is preferable that the ratio between the off resistance 5 off and the impedance of the capacitor 4 be 900 or greater.

As noted above, from the results of the experiments regarding the on resistance and the off resistance of the N transistor 5 used as a semiconductor switch shown in FIG. 2 (c), by setting the on resistance and the off resistance each at preferable values, it is possible to improve the sensitivity and the selectivity of the tuning circuit 1 shown in FIG. 1, which the first embodiment of the present invention. Although the first embodiment of the present invention uses an N channel MOS transistor as the semiconductor switch 5, the use is not restricted to an N transistor, and it is possible to use a P-channel MOS transistor as well. It is also possible to use a transmission gate made from a combination of an N-channel and a P-channel MOS transistor pair, and further possible to use a bipolar transistor.

Additionally, by selecting the on resistance of the N transistors 5a through 5f as shown in FIG. 1, in accordance with the above-noted criteria, it is possible to minimize the transistor size. For example, although the electrostatic capacitance of the capacitor 4a in FIG. 1 is 12.5 pF, the impedance thereof at a frequency of 40 kHz being approximately 300 kΩ. Because, from the above-described experiments, the preferable value of the resistance/capacitor impedance ratio (for example, for an antenna gain attenuated by 3 dB) is 0.0084 or lower, the corresponding on resistance is 300 kΩ×0.0084=2.5 kΩ. An on resistance of 2.5 kΩ can be achieved with N transistors 5a through 5f that are sufficiently small.

The largest electrostatic capacitance was the 400 pF of the capacitor 4f, the calculated impedance thereof being approximately 10 kΩ, and in the same manner if the resistance/capacitor impedance ratio is taken as 0.0084, the corresponding on resistance is 84Ω. This on resistance of 84Ω can be sufficiently implemented as long as the N transistors 5a through 5f can be made at least a certain size.

That is, because a size of the N transistors serving as the semiconductor switches 5, can be selected to be a minimum size, in accordance with the electrostatic capacitance of the capacitors 4 connected in series in the present invention, it is possible to reduce the size of the chip of the tuning IC 3 as much as possible, thereby enabling the achievement of a compact, low-cost implementation.

Additionally, because it is possible to make the size of the N transistors small, it is possible to reduce the parasitic capacitances and floating capacitance occurring due to the N transistors can be reduced to the minimum, thereby enabling variation from a very small capacitance to a large capacitance, so as to enable a tuning apparatus having a superior tuning circuit.

The same effect can be cited with regard to the off resistance of the N transistors 5a through 5f shown in FIG. 1. For example, the preferable value of the off resistance of the N transistor 5a relative to the above-noted capacitor 4a of 12.5 pF (for example, for an antenna gain attenuated by 3 dB), because the resistance/capacitor impedance ratio is 300 or greater, is 300 kΩ×300=90 MΩ. In this case, with a MOS transistor having an on resistance of 2.5 kΩ, it is sufficiently possible to achieve an off resistance of 90 MΩ, even at a low power supply voltage.

Also, if a similar calculation is made of the preferable value of off resistance for the N transistor 5f relative to the 400 pF capacitors 4f, we have 10 kΩ×300=3 MΩ. This off resistance of 3 MΩ can be sufficiently achieved in a MOS transistor having an on resistance of 84Ω, even at a low power supply voltage. By selecting optimal values of the on resistance and the off resistance for the series-connected capacitors in this manner, it is possible to achieve a tuning apparatus with a superior tuning circuit, even in the case of low-voltage drive.

As noted above, because the plurality of capacitors 4a through 4f within the tuning IC 3 are capacitors having an oxide film dielectric, such as $SiO_2$ or the like, they have an extremely small leakage current compared with capacitors that use a depletion region, and therefore are superior capacitors with very small loss. As a result, it is possible to achieve a high Q value in the tuning circuit formed with the receiving antenna 2, thereby enabling the implementation of a highly stable tuning apparatus with high selectivity with regard to received radio waves.

Next, the upper limit value of the total electrostatic capacitance of the plurality of capacitors formed within the tuning IC 3 will be described. If packaging efficiency is considered, the chip size of the tuning IC 3 cannot be made very large and, because the size of the chip leads directly to a cost increase, it is preferable that this be made as small as possible. For these reasons, it is preferable to make the size of the chip of the tuning IC 3 equivalent to that of a 2016 size chip component, which is 2 mm×1.6 mm or smaller. As noted above, if the capacitor is formed by an oxide film and the thickness of the oxide film is approximately 120 Å, the maximum overall electrostatic capacitance that can be formed within the chip size is approximately 9600 pF. Therefore, it is preferable that the overall electrostatic capacitance of the tuning IC 3 be 9600 pF or smaller.

The capacitors in the present invention are not restricted to being oxide film capacitors, and can also be nitride film capacitors or capacitors using a different type of dielectric material.

Additionally, because the tuning IC 3 also includes pads for mounting and a control means with semiconductor switches and a counter circuit and the like, if the surface area occupied by these elements is subtracted, the surface area that can be used for the capacitors becomes approximately 1.6 mm×1.2 mm, and the calculated electrostatic capacitance from this surface area is approximately 5760 pF. Thus, it is preferable that the overall electrostatic capacitance of the tuning IC 3 be 5760 pF or lower. Additionally, if such items as the spreading of the potting resin used to mount the tuning IC 3 and the thickness of the molding material are considered, it is necessary to make the chip size even smaller, and from these conditions the result of a calculation of the overall electrostatic capacitance of the capacitors to be incorporated therewithin is approximately 960 pF. Therefore it is more preferable that the overall electrostatic capacitance of the tuning IC 3 be 960 pF or smaller.

Next, the lower limit value of the inductance of the receiving antenna 2 will be described. If the tuning circuit 1, which is the first embodiment of the present invention, is used as the tuning apparatus of a radio-controlled timepiece, the transmitting station of all the standard radio wave transmitting stations received by the radio-controlled timepiece having the highest frequency is DCF77 in Germany, which has a transmitting frequency of 77.5 kHz.

As described above, considering the chip size and the like, it is preferable that the overall electrostatic capacitance of the tuning IC 3 be a maximum of approximately 9600 pF. From these two conditions, the inductance of the receiving antenna 2 is calculated to be approximately 0.44 mH. It is therefore preferable that the inductance of the receiving antenna 2 be 0.44 mH or greater.

As described above, the overall electrostatic capacitance of the tuning IC 3, considering such things as the surface area occupied by mounting pads and a controlling means, is approximately 5760 pF, and from this condition, the calculated inductance of the receiving antenna 2 is approximately 0.73 mH.

It is therefore preferable that the inductance of the receiving antenna 2 be 0.73 mH or greater. As further noted above, the overall electrostatic capacitance of the tuning IC 3, considering such things as the size of spreading of potting resin for mounting element on the tuning IC 3, is approximately 960 pF, so that the calculation of the inductance of the receiving antenna 2 becomes approximately 4.4 mH. It is preferable, therefore, that the inductance of the receiving antenna 2 be 4.4 mH or greater.

Next, the upper limit value of the inductance of the receiving antenna 2 will be described.

If the tuning circuit 1, which is the first embodiment of the present invention, is used as the tuning apparatus of a radio-controlled timepiece, the transmitting station among all the standard radio wave transmitting stations received by the radio-controlled timepiece and having the lowest frequency is the Fukushima Station in Japan, which has a transmitting frequency of 40 kHz. The total value of the parasitic capacitances and floating capacitances within the tuning IC 3 when all the capacitors within the tuning IC 3 are disconnected from the receiving antenna 2 can be imagined to be a very small value of approximately 4 pF. From these two conditions, if the inductance of the receiving antenna 2 is calculated, the result is approximately 4000 mH. It is preferable, therefore, that the inductance of the receiving antenna 2 be 4000 mH or smaller.

Additionally, if the parasitic capacitance of the receiving antenna 2 is considered, the overall electrostatic capacitance when all the capacitors in the tuning IC 3 are disconnected from the receiving antenna 2 is approximately 14 pF. Calculating the inductance of the receiving antenna 2 from this condition, the result is approximately 1100 mH. It is further preferable, therefore, that the inductance of the receiving antenna 2 be 1100 mH or smaller.

As noted above, according to the first embodiment of the present invention, by a combination of semiconductor switches and capacitors having an extremely small leakage current provided on a single semiconductor substrate, it is possible to achieve high Q value and superior stability thereof, and to implement a tuning apparatus having a wide range of tuned frequency variability. If the on resistance and the off resistance are selected as preferable values in accordance with the impedance of the capacitors connected to the semiconductor switches, it is possible to reduce the loss of the tuning circuit, and achieve a high-sensitivity tuning apparatus. Because by selecting the on resistance and the off resistance of the semiconductor switches it is possible to minimize the size of the transistors, it is possible to reduce the packaging surface area and cost of the tuning IC, and minimize the floating capacitance and parasitic capacitance of the tuning IC, making it possible to provide a superior tuning apparatus with a variable capacitance range in its tuning circuit from a very small capacitance to a large capacitance.

Because the plurality of capacitors in the tuning circuit are formed within the semiconductor substrate, it is possible to greatly reduce the number of externally connected components, thereby enabling a reduction in the side of the tuning apparatus and a simplification of the manufacturing process. Because the switching of the plurality of capacitors forming the tuning circuit is implemented using MOS transistors acting as semiconductor switches, the power supply used for this switching can be a single power supply used in common with the other circuitry, and because a separate negative supply is not required, it is possible to simplify the power supply circuit, reduce the power consumption, reduce the size, and reduce the cost.

The method of measuring the antenna gain and the Q value used in evaluating the antenna characteristics in the present invention is described below, with reference made to FIG. 17 through FIG. 20.

Specifically, a Hewlett-Packard (HP) network analyzer (4195A), a Hewlett-Packard (HP) high-frequency probe (85024A), and a National (Matsushita Electric) transmitting antenna (test loop: 75Q, VQ-085F) were connected as shown in FIG. 17 to form the antenna evaluation circuit. The high-frequency probe (85024A) to which an antenna to be measured is connected and the sample support section were disposed in the vicinity of the transmitting antenna (test loop: 75Q, VQ-085F) and the prescribed antenna-under-measurement was placed on the sample support section, after which a prescribed radio wave was generated from the transmitting antenna (test loop: 75Q, VQ-085F), and the output of the prescribed antenna-under-measurement was detected by the high-frequency probe (85024A) and the prescribed antenna evaluation was performed by the network analyzer (4196A).

In the above-noted evaluation apparatus, the distance between the antenna-under-measurement structure 2 and the transmitting antenna (test loop: 75Q, VQ085F), was established, as shown in FIG. 18, as 11 cm, so that the receiving antenna for evaluation is placed below the lower end of the transmitting antenna with a distance of 11 cm, as shown in FIG. 19, the antenna-under-measurement structure 2 was brought into contact with a metal exterior part 3.

The metal materials used for the metal exterior part used in the above example were SUS, Ti, a Ti alloy, and BS and the like, with a thickness of 5 mm.

Additionally, in the above-noted example, the frequency of the radio wave generated from the transmitting antenna (test loop: 75Q, VQ-085F) is set at 40 kHz and the method for measurement of a resonant antenna with the frequency of 40 kHz is described below, with reference to FIG. 20.

Figure 20:
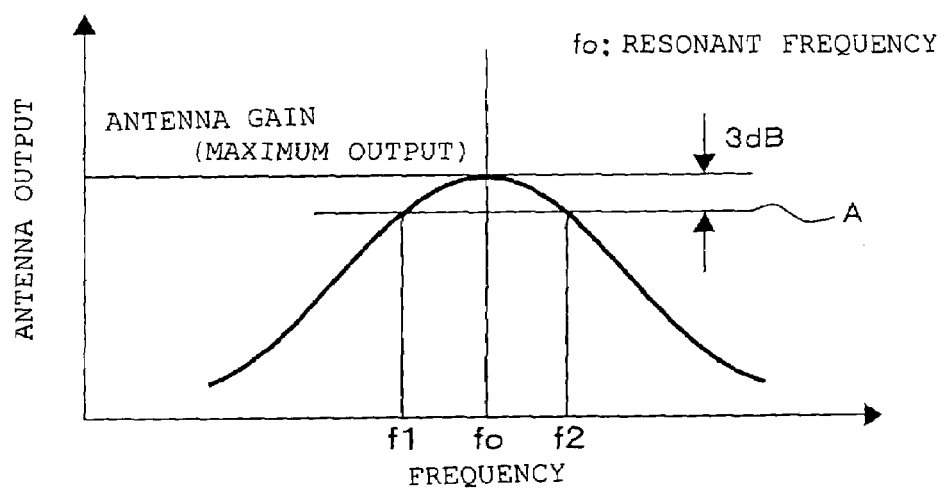

Specifically, a sweep was made to the transmitting antenna (test loop: 75Q, VQ-085F) over the frequency range from 20 to 60 kHz from the network analyzer (4196A), and the output of the antenna-under-measurement 2 was monitored via the high-frequency probe (85024A) and the output results shown in FIG. 20 were obtained.

The antenna gain is expressed in this case as the ratio of the input voltage amplitude to the transmitting antenna to the output voltage amplitude from the antenna-under-measurement, and in FIG. 20 the frequency at which the antenna output is maximum is the resonant frequency (f0), the above-noted ratio value at the point of maximum antenna output being the antenna gain.

Also, in FIG. 20 the level indicated by A is the level that is reduced by 3 dB ($1/\sqrt{2}$) from the highest antenna output level, and with the frequencies giving that level being f1 and f2, the Q value is calculated as follows.

$$Q \text{ value} = \text{Resonant frequency } f0 \div (f2 - f1)$$

Therefore, the Q value is calculated by determining f1 and f2 from the above-noted measurement results and dividing the resonant frequency f0 by (f2−f1).

Figure 5:
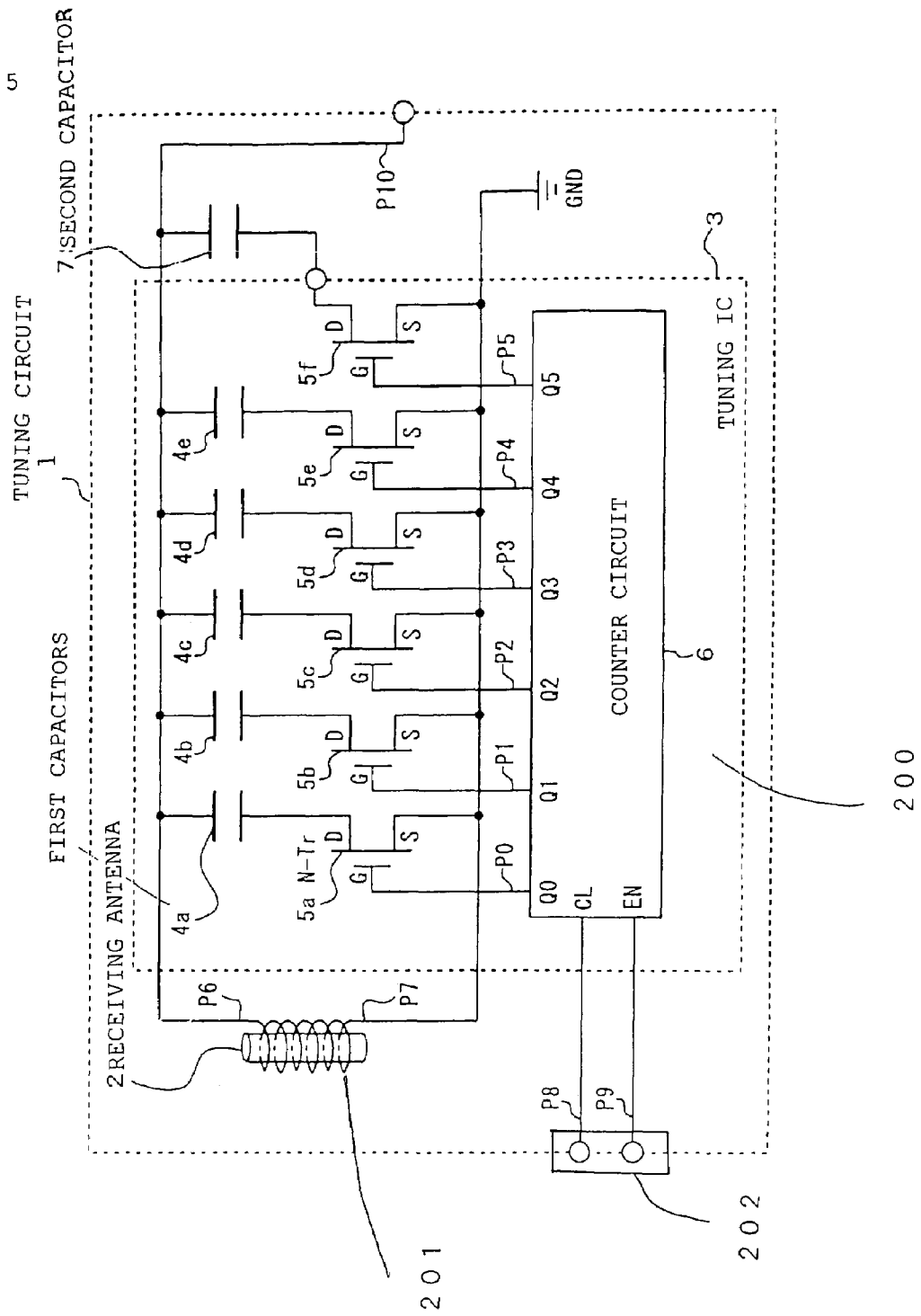
FIG. 5 is a circuit diagram of a tuning circuit according to a second embodiment of the present invention.

Next, the constitution of a constitution according to the second embodiment of the present invention is described below, based on FIG. 5. FIG. 5 is a circuit diagram of a tuning apparatus according to the second embodiment of the present invention. As shown in the drawing, a plurality of semiconductor switches 5, a plurality of first capacitors 4 each connected in series with a semiconductor switch 5, and a switch controlling means 6, which controls the opening and closing of the individual semiconductor switches 5 for the purpose of setting a prescribed value of total electrostatic capacitance based upon the plurality of the first capacitors 4 are formed on a single semiconductor substrate 200.

Furthermore, in the tuning circuit 1, a coil 201 forming the antenna 2, which is connected in parallel with each one of the plurality of first capacitors 4, is further provided outside the semiconductor substrate 200, and a second capacitor 7 having fixed or variable capacitance, which is connected to the coil 201 in parallel with the group of first capacitors 4 is also provided outside or on the semiconductor substrate 200.

Specifically, in the tuning circuit 1 given as the second embodiment of the present invention, in the tuning circuit 1 there is at least one second capacitor 7, is added to the tuning circuit 1 of the first embodiment wherein the second capacitor having a fixed or variable capacitance, and provided on the semiconductor substrate 200 or outside the semiconductor substrate 200, and which is connected to the coil 201 in parallel with the first capacitors 4.

Additionally, in the tuning circuit 1 of the second embodiment of the present invention, the second capacitor 7 is preferably subjected to control that is different from the control to which the first capacitors 4 are subjected, and it is desirable that the capacitance of the second capacitor 7 is different from each one of the capacitance of the first capacitor 4, respectively.

In particular, it is desirable that the electrostatic capacitance of the second capacitor be quite a bit larger than the electrostatic capacitance of the first capacitor.

At least one of the second capacitors 7 in the second embodiment of the present invention has a suitable switching means 5f, and the configuration is such that the switching means 5f is controlled by the controlling means 6.

In this embodiment, the switching means 5f can be a semiconductor switch 5 provided on the semiconductor substrate 200 in the same manner as in the first embodiment, or can also be formed at a position at a distance from the semiconductor substrate 200.

Additionally, the switching means 5f can be configured so that it is controlled by a controlling means that is different from the controlling means 6.

It is desirable that the first capacitors 4 and the second capacitor 7 be configured so that they are driven by mutually different control systems.

The tuning circuit according to the second embodiment of the present invention is described in detail below, wherein elements that are the same as in the first embodiment are assigned the same reference numerals and are not described.

Specifically, in FIG. 5, 1 is a tuning circuit, which is the second embodiment of the present invention. 7 is a second capacitor disposed outside the tuning IC 3, one terminal of the second capacitor 7 being connected to the tuned signal P10 output from the tuning IC 3, and the other terminal thereof being connected to the drain terminal D of the N transistor 5f as a semiconductor switch within the tuning IC 3. Although it is preferable that the second capacitor 7 be a chip-type ceramic capacitor, it is also possible for the second capacitor 7 to have a fixed electrostatic capacitance or to have a variable electrostatic capacitance.

It is obvious that the second capacitor 7 can alternatively be formed on the semiconductor substrate 200.

In this case, the electrostatic capacitance of the first capacitors 4a through 4f internal to the tuning IC 3 are supposed to be formed by the capacitor 4a of 12.5 pF, the capacitor 4b of 25 pF, the capacitor 4c of 50 pF, the capacitor 4d of 100 pF, and the capacitor 4e of 200 pF, respectively.

The electrostatic capacitance of the second capacitor 7 disposed outside the tuning IC 3 is 400 pF. In this case, because the resolution and maximum value of the electrostatic capacitance varied in accordance with the N transistors 5a through 5f are equal to the values in the first embodiment, the performance does not change, although because the overall electrostatic capacitance of the first capacitors formed inside the tuning IC 3 is halved to 387.5 pF, it is possible to make a great reduction in the chip size of the tuning IC 3, enabling an improvement in packaging efficiency and a reduction in cost.

Also, if a second capacitor 7 is placed on the outside without reducing neither the total value of the electrostatic capacitance nor the number of the first capacitors 4 within the tuning IC 3, it is possible to multiply the total electrostatic capacitance, thereby enabling a further broadening of the range of variation of the tuned frequency. Although in the second embodiment of the present invention, there is one second capacitor disposed outside the tuning IC 3, the number is not restricted, and it is also possible to have two or more second capacitors. In addition, it is possible to eliminate all of the first capacitors 4a to 4e, and dispose all of the capacitors outside of the tuning IC 3. By doing this, although there is an increase in the number of components in the tuning IC 1, because it is possible to reduce the chip size of the tuning IC 3, it is possible to achieve a great cost reduction in the tuning IC 3.

A tuning circuit 1 according to the second embodiment of the present invention is described in detail below, with references made to FIG. 13 and FIG. 14.

More specifically, in the case in which an antenna is used having a capacitance that cannot be accommodated by a tuning circuit of the past as shown in FIG. 12, connection is made in this embodiment, as shown in FIG. 13, with the commercially available capacitors C7, C8 and C9 separated from the semiconductor substrate 200, so that tuning is performed. The capacitances of the commercially available capacitors that are connected beforehand are 1,800 pF for C7, 1500 pF for C8, and 4290 pF (3900 pF+390 pF) for C9.

The capacitances in the tuning system are C1 equals 20 pF, C2=40 pF, C3=80 pF, C4=160 pF, C5=320 pF and C6=640 pF.

In making these settings, in the case in which the frequency of the standard radio wave that includes time information is 77.5 kHz and tuning is to be performed in order to receive this signal, SW7 and SW8 are set to off, placing C1 in the connected condition, a 77.5 kHz signal is sent, and the combination of switches having the highest antenna output is taken as the tuned setting value.

Additionally, in the case of tuning to 60 kHz, SW7 is set to on, SW8 is set to off, C1 and C2 are connected, a 60 kHz signal is sent, and the combination of switches having the highest antenna output is taken as the tuned setting value.

Similarly, in the case of tuning to 40 kHz, switches SW7 and SW8 are set to on, so that C1, C2, and C3 are connected, a 40 kHz signal is sent, and the combination of switches for the highest antenna output is taken as the tuned setting value.

In the tuning system such as described above, when performing tuning to three stations, it is sufficient to determine resonant frequencies only approximately three times, and it is only necessary to solder three capacitors once, there by shortening the process of adjustment and mounting.

Although the above description is for the case of receiving three stations, this applies as well to cases in which tuning is done to two stations or one station.

In another example, as shown in FIG. 14, a second capacitor, C10, is added at a location that is distanced from the semiconductor substrate 200 and between the antenna 2 and the tuning circuit 1 and frequency adjustment is performed in the system, this, of course, enabling tuning to one station or to two or more stations.

In this case, as noted above, the second capacitors C8, C9, and C10 can be formed on the semiconductor substrate 200, or can alternatively be formed outside the semiconductor substrate 200.

The tuning circuit 1 according to the present invention, as noted above has superior antenna characteristics, making it usable, including the antenna 2, within a metal exterior part that is made of a metallic material.

Next, a radio-controlled timepiece 40 according to the present invention that incorporates a tuning apparatus of the present invention, will be described.

FIG. 6 describes the relationship between a radio-controlled timepiece 40 and a transmitting station 45, which transmits a standard radio wave as shown in the third embodiment of the present invention, in that a tuning device including a tuning circuit 1 is incorporated.

In FIG. 6, 40 denotes an analog-display-type radio-controlled timepiece. 41 is an metal exterior part made of a metallic material, 42 is a display as a display means, 42a is a second hand, 42b is a minute hand, 42c is an hour hand and 42d is a date display that indicates the date. The reference 2 indicates an ultra-compact receiving antenna, which is preferably disposed at the 12-o'clock position within the metal exterior part 41. 43 is a stem used to correct the time and date, and 44 is a band for the purpose of holding the watch on the hand of a user (not illustrated).

The reference numeral 45 is a transmitting station that transmits a standard radio wave. 46 is a transmitting antenna that radiates the standard radio wave, and 47 is an atomic clock that keeps standard time with high precision. 48 is a standard radio wave that carries standard time as the time information that is transmitted from the transmitting antenna 46. The standard radio wave 48 is a long-wave signal, which is usually several tens of kHz, this being receivable over a range having a radius of approximately 1,000 km. Furthermore, the transmitting frequency and time information format of the standard radio wave 48 is set differently, depending upon the country, and/or the region of the transmitting station.

In this case, in order for the radio-controlled timepiece 40 to receive the standard radio wave 48, as described above, the receiving antenna 2 is disposed at the 12 o'clock position within the metal exterior part 41, and preferably the 12-o'clock position of the radio-controlled timepiece 40 is oriented towards the transmitting station 45, as a receiving start button (not illustrated) is operated. When the radio-controlled timepiece 40 receives a standard radio wave 48, an interpreting algorithm in accordance with the timed information format of the standard radio wave 48 is used to perform interpretation, data is obtained with regard to the second, minute, hour and data and, if necessary, with regard to leap year or daylight savings time, and the thus-acquired time information is kept and displayed as time information and/or date by the display 42. In addition, reception of the standard radio wave 48 is preferably executed periodically in the late evening, in which the receiving environment has a small amount of noise.

Figure 7:
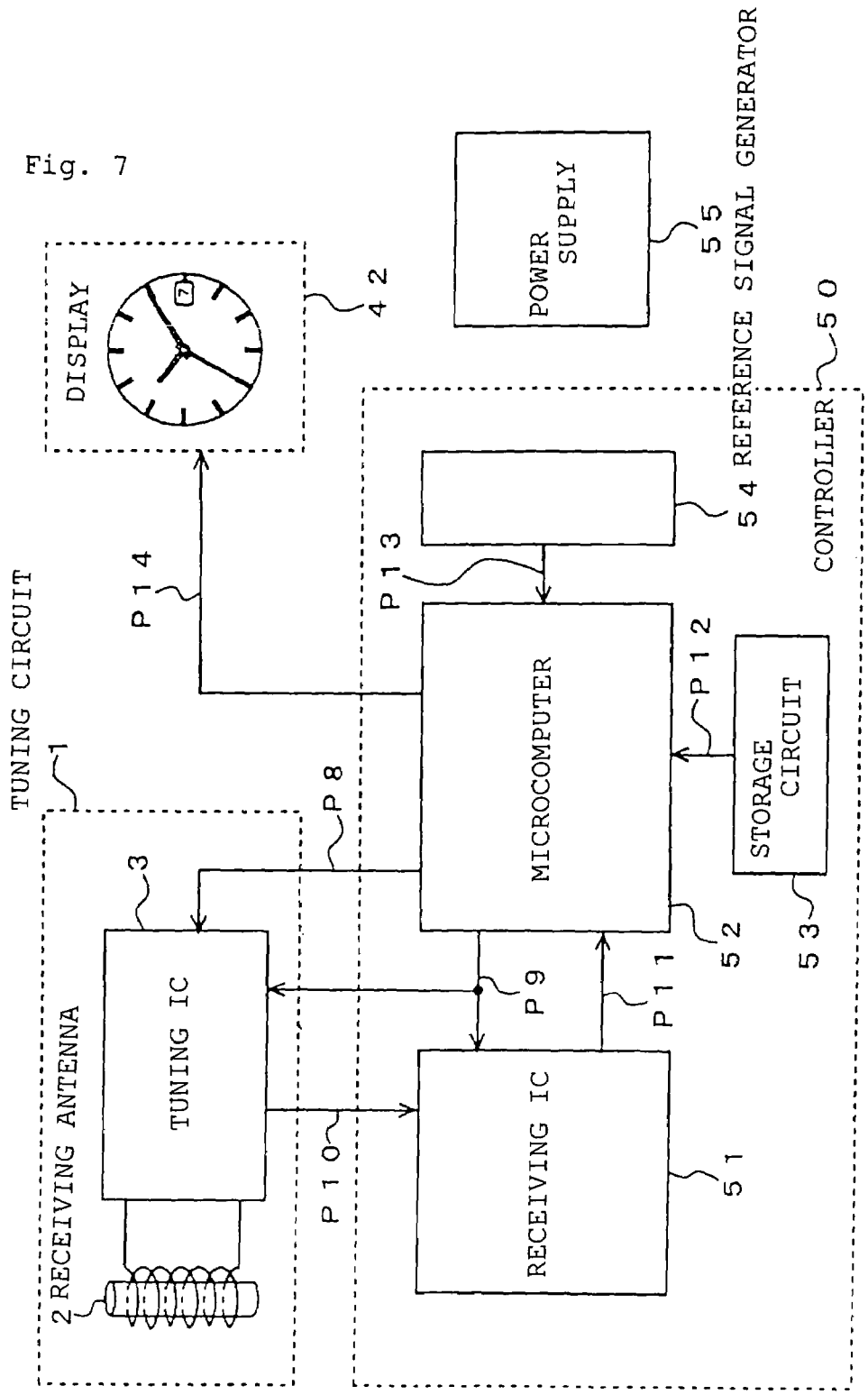
FIG. 7 is a circuit block diagram of a radio-controlled timepiece according to a third embodiment of the present invention.

Next, the circuit block diagram configuration of the radio-controlled timepiece 40, according to the third embodiment of the present invention, will be described, with reference made to FIG. 7. In FIG. 7, reference numeral 1 denotes a tuning circuit according to the first embodiment of the present invention. 50 is a controller as a controlling means, which controls the radio-controlled timepiece 40. 51 is a receiving IC, which is included in the controller 50, this including an amplifier circuit (not illustrated), a filter circuit, (not illustrated), and a decoding circuit, (not illustrated), and the like. 52 is a microcomputer, which is included within the controller 50, this performing overall control of the radio-controlled timepiece.

53 is a storage circuit as a tuning storage means, which is included within the controller 50, this storage circuit storing tuning control information. 54 is a reference signal source, which is included within the controller 50, this including a quartz oscillator, (not illustrated), which outputs a reference signal for the radio-controlled timepiece. 42 is a display as a display means of the analog type described earlier and, although not illustrated, this includes such elements as a drive motor and a gear train. 55 is a power supply, which supplies electrical power required by the tuning circuit 1, the display 42, and the controller 50 and the like.

Next, the relationship of the interconnections of each of the blocks will be described. Because the internal parts of the tuning circuit 1 have already been described with regard to the first embodiment, their description will be omitted. The receiving IC 51 of the controller 50 inputs a tuning signal P10, which is the output from the tuning IC 3 of the tuning circuit 1, and outputs a demodulated signal P11, which is converted to a digital signal. The storage circuit 53 outputs tuning data P12 as tuning control information and the reference signal source 54 outputs a 32,768 Hz reference signal P13. The microcomputer 52 of the controller 50 inputs the demodulated signal P11, the tuning data P12, and the reference signal P13, and outputs the enable signal P9 and the time data P14 as time information. The display 42 inputs the time data P14 as time information from the microcomputer 52 and performs time display.

Next, the operation of the radio-controlled timepiece 40 will be described, based on FIG. 7. As shown in FIG. 7, when the power supply 55 supplies electrical power to each one of the various circuit blocks via the power supply line (not illustrated), the microcomputer 52 performs initialization processing so as to initialize each one of the circuit blocks. As a result, the time information within the microcomputer 52 is initialized to 00:00:00 AM, and the time data P14 is output based on this initialized time information. The second hand 42*a*, the minute hand 42*b*, and the hour hand 42*c* of the display 42 move, upon the input of the time data P14, to the reference position, which is 00:00:00 AM. The date display section 42*d* also moves to the reference position.

Next, the reference signal source. 54 starts outputting the reference signal P13. The microcomputer 52 inputs the reference signal P13, internally the frequency thereof is divided, and starts to perform timekeeping of the time information based on the reference signal P13. The time data P14 is output based on the time information, and this is transmitted to the display 42. The display 42, upon inputting the time data P14, sequentially displays the hour, minute, second and date and so on. The microcomputer 52 shifts into the time correction mode in accordance with an external operation or when a timer or the like goes through a given amount of time, and then begins receiving operation for the purpose of receiving a standard radio wave.

What follows is a description of the operation in the time correction mode. When the radio-controlled timepiece 40 goes into the time correction mode, the microcomputer 52 outputs the enable signal P9 to the tuning IC 3 of the tuning circuit 1 and to the receiving IC 51 of the controller 50. By means of the enable signal P9, the tuning IC 3 reset condition is released, thereby placing it in the standby condition, in which it can accept input of the clock signal P8. By means of the enable signal P9, the receiving IC 51 supplies power to the amplifier circuit (not illustrated), the filter circuit (not illustrated), and the decoding circuit (not illustrated), which go into the standby state. Next, the microcomputer 52 accesses the storage circuit 53 and acquires the tuning data P12 as tuning control information, and then outputs the clock signal P8 for the purpose of adjusting the tuned frequency of the tuning circuit 1, based on the tuning data P12.

Next, the tuning IC 3 of the tuning circuit 1 inputs the clock signal P8 and, as described above, in accordance with the number of pulses of the clock signal P8, switches the capacitors for 4*a* through 4*f* incorporated within the tuning IC 3, so as to vary the tuned frequency that is tuned with the receiving antenna 2 and select the desired standard radio wave and receive it. Next, when the desired standard radio wave is received, the tuning IC 3 outputs the tuned signal P10, this being input to the receiving IC 51. The IC 51 inputs the tuned signal P10 and amplifies it then removes noise components and the like by means of a filter circuit, and also converts the signal to a digital signal using a decoding circuit, outputting the demodulated signal P11.

Next, having input the demodulated signal P11, the microcomputer 52 uses an interpreting algorithm stored therewithin to interpret the demodulated signal P11, thereby acquiring the standard time information such as hour, minute, second and date and the like, and corrects the time information stored internally within the microcomputer 52 so as to store the correct standard time. Next, the display 42 inputs the time data P14 which has been corrected so that it displays the corrected time. The storage circuit 53, although a non-volatile memory that can be rewritten, such as a flash memory is implementable, can also be a low-cost fuse ROM or a memory formed by pattern cutting means whereby the conductive patterns are processed on a printed circuit board (not illustrated) onto which is mounted the microcomputer 52 and the like.

As described above, the microcomputer 52 of the controller 50 performs control of the tuning circuit 1 in accordance with tuning control information of the storage circuit 53, adjusting the tuning circuit 1 so that the tuned frequency thereof is aligned with high precision to the transmitting frequency of the desired standard radio wave. The result is the ability to receive the standard radio wave with a high degree of sensitivity and stability, thereby providing a radio-controlled timepiece with high reliability.

Next, the configuration of the tuning circuit 1 for the case in which the radio-controlled timepiece 40 is housed in a metal exterior part 41 will be described. The radio-controlled timepiece 40, according to the present invention, as described earlier with regard to FIG. 6, is covered by a metal exterior part 41, thereby providing mechanical protection for the tuning circuit 1, the display 42, and the controller 50 and the like. In this case, the use of a plastic material, which passes radio waves, as the material for the exterior part, provides the ability to achieve a high antenna gain making it easy to receive the standard radio wave. However, because of the lack of hardness of the plastic material, it tends to be damageable when used as an exterior part.

Additionally, it involves problems with watertightness, and is also difficult to use from the standpoint of achieving a feeling of high quality. In order to solve these problems, it is preferable that a metal exterior part be used. However, because radio waves do not easily pass through a metal exterior part, there is the problem of a drop in the antenna gain.

An effective method of solving the problem of the reduction in antenna gain caused by the use of the metal exterior part 41 is to increase the number of turns of wire of the receiving antenna 2. The reason for this is based upon the principle of electromagnetic induction, in accordance with which it is known that the electromotive force induced in a coil increases in proportion to the number of turns of the coil.

Specifically, although there is a significant attenuation of the magnetic field from the standard radio wave that reaches the receiving antenna 2 disposed within the metal exterior part due to making use off the metal exterior part, by increasing the number of wire turns on the receiving antenna 2, it is possible to increase the electromotive force induced in the receiving antenna 2, thereby preventing a decrease in the antenna gain by compensating for the attenuation of the magnetic field.

In this case, in order to prevent the decrease in the antenna gain caused by the metal exterior part 41, the inventor of the present invention performed verifications based on various conditions, in order to determine the appropriate degree of increase in number of turns of wire on the receiving antenna 2.

The result of this was data that indicated that if the inductance of the receiving antenna 2 is 20 mH or greater, it is possible to compensate for the decrease in the antenna gain. For this reason, it is preferable that the inductance of the receiving antenna gain in the case of using a metal exterior part for the radio-controlled timepiece, be 20 mH or greater.

However, when the inductance of the receiving antenna 2 is increased, the total electrostatic capacitance and minimum resolution of the total electrostatic capacitance of the capacitors forming the tuning circuit (for example, capacitors 4a through 4f in FIG. 1) that are combined with the receiving antenna 2 must be made considerably small.

For example, in the tuning circuit 1, if the inductance of the receiving antenna 2 is made 20 mH, in the case the tuned frequency of the tuning circuit is set at 77.5 kHz which is the highest transmitting frequency among the standard radio waves, the total electrostatic capacitance of the capacitors 4a to 4f must be approximately 200 pF and the minimum resolution must to approximately 1 pF.

In order to switch such very small electrostatic capacitances, it is necessary to minimize as much as possible floating capacitances and parasitic capacitances. In the tuning apparatus, according to the present invention, as described above, it is possible to minimize floating capacitances and parasitic capacitances within the tuning IC 3, so that even if the inductance of the receiving antenna 2 is 20 mH or greater, it is possible to form a tuning circuit that can be sufficiently accommodated.

As described above, a, according to the third embodiment of the present invention has an exterior part that is difficult to damage, features good watertightness, and also can make use of the metal exterior part 41 that provides a feeling of high quality, making it highly effective in increasing the perceived value of the radio-controlled timepiece 40 as a product.

Additionally, the radio-controlled timepiece 40, according to the present invention, controls the tuned circuit 1 and varies the tuned frequency in order to adjust the tuned frequency to the proper frequency for the desired standard radio wave. The present invention, however, is not restricted to this adjustment means, and can also be applied to the use of a standard radio wave selection means to make an arbitrary selection of a standard radio wave from a plurality of standard radio waves having different frequencies.

Specifically, there are two transmitting stations that transmit standard radio waves within Japan, one of them being the Fukushima station transmitting on 40 kHz, and the other being the Saga station in Kyushu transmitting at a frequency of 60 kHz. Therefore, in the case of using a radio-controlled timepiece in Japan, it is desirable to be able to arbitrarily receive one of the standard radio waves from these two stations.

One means for receiving a plurality of standard radio waves having different frequencies of transmission is that of varying the number of pulses of the clock signal P8 from the microcomputer 52, opening and closing the N transistors 5a through 5f within the tuning IC 3 so as to switch the capacitors 4a through 4f thereby adjusting the tuned frequency of the tuning IC 3 to the transmitting frequency of the desired standard radio wave. By doing this, it is possible to easily achieve a radio-controlled timepiece that accommodates multi-channel reception arbitrarily selected from a plurality of standard radio waves.

Next, an example will be described in which a radio-controlled timepiece, according to the present invention, is moved to a different country or region, and in which selection is made of a received station transmitting a standard radio wave arbitrarily from the plurality of stations transmitting standard radio waves that include time information, so that the time information of the radio-controlled timepiece is adjusted to the precise time information in that country or region.

FIG. 21 is a circuit block diagram of a radio-controlled timepiece in the example of execution of a method of correcting the time information of the radio-controlled timepiece in the present invention.

In FIG. 21, elements of the constitution that are the same as were described with regard to the radio-controlled timepiece of the present invention shown in FIG. 7 have been assigned the same reference numerals and will not be described in detail herein.

Specifically, in FIG. 21, 1 is the tuning circuit 1 as a receiving means that includes a receiving antenna 2 and a tuning IC 3. This also includes a receiving antenna 2, which receives a standard radio wave, and a tuning IC circuit 3 that is formed by the receiving antenna 2 and a capacitor for the purpose of selectively receiving a standard radio wave by tuning. The receiving IC 51, which is included within the controller 50, is formed by an appropriate amplifier circuit, filter circuit, and detector circuit and the like.

The receiving circuit 51 inputs a weak standard radio wave that is received by the receiving antenna 2 and the tuning IC 3, amplifies and detects this signal, and outputs a digitalized demodulated signal P11.

52a is a decoding circuit as a decoding means, which, in accordance with an interpreting algorithm stored in the storage means 53 therewithin, inputs the demodulated signal P11 and interprets therefrom the time, and the information format, whereupon it outputs standard time data P52 such as the second, minute, hour, and date, as time information, and the receiving information signal P53 as receiving information, which has a flag indicating success or failure of receiving and a flag indicating the reception processing time period.

The decoding circuit 52a performs digital processing, such as removal of noise components that are mixed with the demodulated signal P11, quantizes the received level of the received standard radio wave, and outputs the received level signal P54 as received level information. 52b is a calculating circuit as a means for performing calculation, which inputs the received information signal P53 and the received level signal P54, encodes the standard radio wave transmitting station that is received, encodes the success or failure of reception, keeps the reception processing time, and encodes the received level information, outputting these as the received information data P55.

53 is a memory circuit as a means for storage, which inputs the above-noted received information data P55, and stores each of the reception condition of each received signal as reception history information.

52c is a reception sequence determining circuit as a means for determining the reception sequence, which inputs, via the received information data P55, the reception history information stored in the memory circuit 53, and determines the order of receiving from the transmitting stations as reception sequence data P56. 52d is a control circuit as a means for controlling, which inputs the standard time data P52 and outputs the time setting data P57.

The control circuit 52d also inputs the received information data P55 and the reception sequence data P56, and outputs the selection signal P58, which establishes the priority of selection of the transmitting stations. The control circuit 52d also inputs the received information signal P53, and makes a judgment, based on the reception success/failure flag, as to whether the reception operation was successful or failed. The control circuit 52d also, by means of the received information data P55 and the reception sequence data P56, and based on the transmitting station received the last time or on the reception sequence determined by the reception sequence determining means, outputs a transmitting station display signal P59, which represents the transmitting station that is to be received with priority from now on, or the transmitting station that is currently being received.

The tuning IC 3 of the tuning circuit 1, along with the receiving IC 51 and the decoding IC 52a, input the selection signal P58 from the control circuit 52d. In accordance with the selection signal P58, the tuning IC 3 switches the internal capacitors (not illustrated), changes the frequency tuned with the receiving antenna 2, and selects the standard radio wave that is received. The receiving IC 51 switches the circuit constants of an internal filter circuit (not illustrated) and a detection circuit (not illustrated), and performs amplification and detection of a weak standard radio wave that is selectively received by the receiving antenna 2 and the tuning IC 3.

The decoding circuit 52a switches the above-noted internal interpreting algorithm by means of the selection signal P58, and interprets the time information format of the received standard radio wave. 54 is a reference signal generator having an internal quartz crystal oscillator (not illustrated), which outputs a reference signal P13. 52e is a timekeeping circuit as a means for keeping time, which inputs the time setting data P57, sets the precise time information acquired form the standard radio wave, and also keeps time by the reference signal P13, and outputs the time display signal P61.

The display 42 is formed by the above-noted second hand, minute hand, hour hand, and data display part and the like, has a mechanical transmission mechanism formed by such elements as a motor and a gear train, and inputs the time display signal P61 so as to display the time information.

The display 42, if necessary, inputs the transmitting station display signal P59, and indicates, using the second hand or minute hand or the like to indicate either the station that will be received with priority from now on or the station currently being received, based either on the transmitting station received last time or on the reception sequence determined by the reception sequence determining circuit 52c. The transmitting station display can be made, instead of the second or minute hand, in digital form, by a compact LCD display or the like.

55 is a primary or secondary battery or the like, serving as a power supply, this supplying electrical power to the various circuit blocks, via a power line (not illustrated) Additionally, it is alternatively possible to implement the decoding circuit 52a, the calculation circuit 52b, the reception sequence determining circuit 52c, the control circuit 52d, and the timekeeping circuit 52e, which are enclosed in a bold broken line, as a single-chip microcomputer as a control means 50, with the various functions being implemented by firmware, and there is no restriction of the present invention to the configuration shown in the embodiment of FIG. 21.

Also, although the memory circuit 53 in the example shown is formed within the controller 50, the memory circuit 53 can alternatively be formed outside the controller 50. Although in this embodiment the received level signal P54 that indicates the standard radio wave received level information is generated by digital processing by the decoding circuit 52a, there is no restriction to this method, and it is alternatively possible, for example, to perform analog generation, based on the field strength of the standard radio wave received by the receiving IC 51.

Next, the basic operation of the radio-controlled timepiece 1, which is an embodiment of the present invention, is described below, based on FIG. 21.

When the power supply 55 supplies electrical power to the various circuit blocks via the power line (not illustrated), the control circuit 52 performs initialization processing so as to initialize the various circuit blocks. As a result, the timekeeping circuit 52e is initialized, so that the time becomes 00:00:00 AM, and the second and hour hands of the display 42 move, in accordance with the time display signal P61, to the reference position, which is 00:00:00 AM. The date display section also moves to the reference position.

Next, the timekeeping circuit 52e starts keeping time by the reference signal P13 from the reference signal generator 54, and the display means 42 starts to move the hands of the display 42 by the time display signal P61 from the timekeeping circuit 52e. Next, the control circuit 52d sequentially outputs the selection signal P58, and the tuning circuit 1 inputs the selection signal P58 and switches the tuned frequency being received. The decoding circuit 52a also inputs the selection signal P58 and switches the interpreting algorithm, so as to search for the standard radio wave of a transmitting station that can be received. The reception switching of the standard radio wave immediately after initialization can alternatively be manually set by the user.

Next, as a result of the search for a standard radio wave, when the tuning circuit 1 finds a standard radio wave that can be received, it outputs the demodulated signal P11, and the decoding circuit 52a, in accordance with the selected interpreting algorithm, interprets the demodulated signal P11, and when all of the demodulated signal is successfully interpreted, outputs the standard time data P52, the received information signal P53, and the received level signal P54. At this point, because the demodulated signal P11 that is demodulated from the standard radio wave contains all of the time information within a time period of 1 minute, the time required for interpreting the time information is 1 minute.

In order to improve the interpreting accuracy, because it is desirable that the interpreting algorithm of the decoding circuit 52a judge the reception to have succeeded when two consecutive successful interpreting operations have been done, the minimum amount of time required to complete the reception processing is 2 minutes. There are cases in which the decoding circuit 52a, because of noise components on the standard radio wave and a drop in field strength, cannot perform interpreting, resulting in an interpreting error, in which case the reception operation is repeated at 1 minute intervals in an attempt to complete reception.

For this reason, the interpreting algorithm of the decoding circuit 52a is provided with a time limit on the amount of time required for completion of reception and, if this time limit is exceeded before the reception is completed after repeated attempts to interpret, the operation of receiving the standard radio wave is terminated. As a result, the length of receiving time required for interpreting the demodulated signal P11 can be an important factor in understanding the existence of noise components on the received standard radio wave and changes in the field strength thereof.

Next, when the reception is completed and the decoding circuit 52a outputs the standard time data P52, the control circuit 52d inputs the standard time data P52 to acquire the required time information, and outputs the time setting data P57, which is formed by second data, minute data, hour data, date data, and the like.

The timekeeping circuit 52e inputs the time setting data P57, sets this as the time information, and continues keeping time, using the time information as a reference.

The calculation circuit 52b inputs the received information signal P53 and the received level signal P54 output from the decoding circuit 52a, calculates the above-described reception processing time and the like, and outputs the received information data P55, which is input by the memory circuit 53, which stores this as the received station reception history information.

FIG. 22 shows an example of received standard radio wave reception history data stored in the memory circuit 53 by the received information data P55. Specifically, it is possible to store into the memory circuit 53 the reception history information for N received transmitting stations, this reception history information being, as shown in the drawing, the name of the transmitting station, the amount of processing time required to interpret the demodulated signal P11, and the standard radio wave received level and the like.

The reception history of the first transmitting station that is received is stored at address 1, and when the reception history information for the next transmitting station to be received is to be stored the previously received transmitting station reception history information is shifted to address 2 and the new information is stored at address 1. When the number of received transmitting station exceeds N, the (N+1)th reception history information can be deleted, with N being arbitrarily selectable, depending upon the storage capacity of the memory circuit 22.

FIG. 22 shows an example in which reception has been done of 12 transmitting stations, these stations being in the four locations JJY Fukushima (Japan), JJY Kyushu (Japan), DCF77 (Germany), and WWVB (USA). The reception history information for the oldest received transmitting station is stored at address 12, and the reception history information for the newest received transmitting station is stored at address 1.

Address 4 shows an example in which the reception ended unsuccessfully, in which case a reception error is stored in the field for the transmitting station name, and in which case the fields for the reception processing time and received level can be left blank. The reception history information stored in the memory circuit 53 is actually encoded data.

In the tuning circuit 1 according to the present invention, it was discovered that the relationship between the resistance value of the resistance part used in the amplifier circuit connected to the receiving circuit and impedance of the tuning capacitor provided in the tuning apparatus is an important factor as is the relationship between the above-noted on or off resistance of the semiconductor switch and the impedance of the tuning capacitor.

Specifically, it is desirable that the resistance value of the resistance part of the amplifier circuit connected to the receiving circuit be larger than the impedance of the tuning capacitor provided in the tuning apparatus.

That is, in this embodiment it is desirable that the resistance value of the resistance part of the amplifier circuit connected to the tuning circuit be made larger than the impedance of the capacitor connected in series with the resistance part used in the amplifier circuit.

More specifically, it is preferable that the resistance value of the resistance part used in the amplifier circuit be at least 10 times the impedance of the tuning capacitor provided in the tuning apparatus.

What follows is a description, based on FIG. 8, of the relationship between tuning circuit 1 in the present invention and the amplifier circuit 80 within the receiving IC 51 of the radio-controlled timepiece 40.

FIG. 8(a) is a simplified circuit diagram of the tuning circuit 1 and the amplifier circuit 80 of the receiving IC 51, FIG. 8(b) is an equivalent circuit of the above, and FIG. 8(c) is a simplified circuit diagram of the tuning circuit 1 and another amplifier circuit 90 of the receiving IC 51.

In FIG. 8(a), 70 is a tuning circuit generally showing a part of the circuit of the tuning circuit 1 of the present invention, 71 is a receiving antenna, 72 is a capacitor connected to the receiving antenna 72, and 73 is a resistance representing the on or off resistance of a semiconductor switch that opens and close the capacitor 72.

80 is the input amplifier circuit within the receiving IC 51 of a radio-controlled timepiece of the present invention, and 81 is a P-channel MOS transistor (hereinafter called "P transistor"), 82 is an N transistor, with the P transistor 81 and the N transistor 82 forming a CMOS amplifier circuit. 83 is a bias resistance, which receives a fixed voltage supply 84 and supplies a bias voltage to the gate terminal G of the P transistor 81, and 85 is a feedback resistance, which joins the gate terminal G and the drain terminal D of the N transistor 82. 86 and 87 are coupling capacitors, which input the tuned signal P10 from the tuning circuit 70.

Next, the general operation of the tuning circuit 70 and the input amplifier circuit 80 will be described, based on FIG. 8(a). In FIG. 8(a), when a standard radio wave (not illustrated) reaches the receiving antenna 71, by a resonance phenomenon between the receiving antenna 71 and the capacitor 72, the standard radio wave is selected and an electromotive force is generated, so that the tuned signal P10 is output.

The amplifier circuit 80 inputs the tuned signal P10, supplying it, via the coupling capacitors 86 and 87, to the gate terminals G of the P transistor 81 an the N transistor 82, the signal being amplified and output as the output signal P15.

In this case, the equivalent circuit as seen from the input side of the tuning circuit 80 is shown in FIG. 8(b). In FIG. 8(b), 80a is the equivalent circuit of the amplifier circuit 80, in which equivalent circuit 80(a) comprises two series circuits, one in which the coupling capacitor 86 is connected in series with the bias resistance 83, and one in which the coupling capacitor 87 is connected in series with the feedback resistance 85, and they are connected in parallel to each other.

By doing this, because the equivalent circuit 80a is connected to the tuning circuit 70 via the tuned signal P10, depending upon the circuit constants of the equivalent circuit 80a, the capacitor 72 of the tuning circuit 70 is connected in parallel with the coupling capacitors 86 and 87, and as a result there is the problem of a shift in the tuned frequency, making it impossible to properly receive the frequency of the standard radio wave.

In order to solve this problem, as described above with regard to the first embodiment of the present invention, adoption is made of the idea of considering the ratio between the off resistance of the semiconductor switch and the impedance of the capacitor connected in series with the semiconductor switch.

Specifically, in order to remove the influence of the coupling capacitors 86 and 87 on the tuning circuit 70, if the bias resistance 83 and the feedback resistance 85 are made high resistances that are greater than the impedance of coupling capacitors 86 and 87, the coupling capacitors 86, 87 are equivalently isolated from the tuning circuit 70, the result being that it is possible to remove the influence they have on the tuning circuit 70.

In particular in the case in which, as described above, a radio-controlled timepiece is placed within a metal exterior part, because it is necessary to make the inductance of the receiving antenna 71 large, since electrostatic capacitance of the capacitor 72 of the tuning circuit 70 becomes small, the influence of floating and parasitic capacitances tends to be felt. For this reason, in a radio-controlled timepiece that uses a metal exterior part, it is preferable that the ratio between the bias resistance 83 and the feedback resistance 85 and the impedance of the coupling capacitors 86 and 87 be made as large as possible.

In the case of using a metal exterior part in a radio-controlled timepiece, because it is necessary to increase the number of turns of a conductive wire of the receiving antenna 71, not only does the inductance thereof increase, but also the direct current resistance component of the receiving antenna 71 increases from 18Ω to 38Ω and, further because the capacitor 72 is small, the output impedance of the tuning circuit 70 rises considerably. It is therefore necessary, in order to effectively amplify the tuned signal P10, to make the input impedance of the amplifier circuit 80 high.

Note that, because the amplifier circuit 80 is formed by P transistor 81 and N transistor 82, which are MOS transistors, these are suitable for an amplifier circuit with a high input impedance, and in reality the input impedance of the amplifier circuit 80 is determined by the bias resistance 83 and the feedback resistance 85.

For this reason, in the case of a radio-controlled timepiece using a metal exterior part, it is preferable that the resistance values of the bias resistance 83 and the feedback resistance 85 be made as large as possible.

Next, another embodiment of the amplifier circuit within the receiving IC 51 will be described, base on FIG. 8(*c*). In FIG. 8(*c*), 90 is the input amplifier circuit within the receiving IC 51, 91 is a P transistor, 92 is an N transistor, 93 is a feedback resistance which joins the gate terminals G with the drain terminals D of the P transistor 91 and the N transistor 92. Because the tuning circuit 70 is the same as in FIG. 8(*a*), it will not be described. In this case, the amplifier circuit 90 does not have the coupling capacitors 86 and 87 which were in the amplifier circuit 80, and the tuned signal P10 is directly input to the gate terminals of the P transistor 91 and the N transistor 92 for amplification.

In FIG. 8(*c*), the input impedance of the amplifier circuit 90 is dependent upon the feedback resistance 93, and the feedback resistance 93 is equivalently connected in parallel with the feed back resister 93 with respect to the tuning circuit 70. Because of this, if the resistance value of the feedback resistance 93 is small, the loss of the tuning circuit 70 increases, thereby causing the Q value to decrease, not only decreasing the gain of the antenna, but also decreasing the selectivity, which is not desirable. For this reason, it is preferable that the feedback resistance 93 be made at least approximately 10 times the impedance of the capacitor 72 of the tuning circuit 70.

As noted above, by considering the configuration and circuit constants of the receiving circuit IC connected to the tuning circuit 70, it is possible to improve the antenna gain and Q value of the tuning apparatus, and to provide a tuning apparatus and radio-controlled timepiece using same, which have improved performance.

The inventors of the present invention have performed additional experiments with regard to the relationship between the resistance value (feedback resistance and the like) used in the above-noted amplifier circuit and the impedance of the tuning capacitor used in the antenna, these being described below.

The tuning capacitor used in this experiment is such as shown in FIG. 23, the antenna inductance (L value) being 102 mH and the tuning capacitance being 66 pF, and the resonant frequency being 61 kHz. Under this condition, the ratio of the gain attenuation from the gain obtained when the amplifier circuit resistance does not exist to the capacitor impedance when amplifier circuit resistance was varied from 200 kΩ to 33 MΩ, was graphed as shown in FIG. 24.

As can be seen from FIG. 24, the smaller the resistance/capacitor impedance ratio becomes, the more severe the antenna attenuation becomes.

In particular, because of the steep slope with a resistance/capacitor impedance ratio of 8.36 or lower, it is preferable that the resistance/capacitor impedance ratio be made greater than 8.36 (approximately 10).

It is also preferable that the resistance/capacitor impedance ratio be made 25.34 (approximately 25) or greater, in that the slope is even more gradual.

It is even more desirable that the resistance/capacitor impedance ratio be made 172 (approximately 170) or greater, in that the slope is even more gradual.

In the third embodiment of the present invention, although the tuning circuit 1, which is the first embodiment of the present invention, is incorporated in the radio-controlled timepiece 40, this is not a restriction, and it is alternatively possible to incorporate therein the tuning circuit 30, which is the second embodiment of the present invention so as to complete the radio-controlled timepiece 40.

Although in the third embodiment of the present invention the display 3 is an analog display, this is not a restriction, and it is alternatively possible to use a digital type of display utilizing LCD or the like in the display 3, or to have the radio-controlled timepiece use a compound analog/digital display.

Next, the circuit block configuration and operation of a radio-controlled timepiece according to the fourth embodiment of the present invention will be described. Elements that are the same as in the third embodiment have been assigned the same reference numerals and are not described herein.

In FIG. 9, 100 is a tuning apparatus having an internal storage circuit 53 that stores tuning control information. The microcomputer 52 outputs an address signal P16 to the storage circuit 53 within the tuning circuit 100. The storage circuit 53 inputs the address signal P16, reads out tuning control information storage therewithin based on this address signal P16 stored therein, and outputs the tuning data P12.

The tuning IC 101 of the circuit 100 has converter circuit (not illustrated) therein which inputs the tuning data P12, generates a clock signal outputting a pulse in accordance with the data, and switches a plurality of capacitors within the tuning IC 101 so as to adjust the tuning frequency and receive a standard radio wave. Because the operation of the other parts of the radio-controlled timepiece are the same as in the third embodiment, they will not be described herein.

Although in FIG. 9, the storage circuit 53 is disposed outside the tuning IC 101, this is not a restriction, and it is alternatively possible to dispose the storage circuit 53 within the tuning IC 101 and implement the tuning IC 101 as a single chip.

Although the storage circuit can be a non-volatile memory such as a flash memory or the like, which enables rewriting, it can alternatively be an inexpensive fuse ROM, or a means of forming a memory by cutting the conductive patterns on a printed circuit board (not illustrated) onto which is mounted the tuning IC 101. Similar to the third embodiment, the fourth embodiment of the present invention not only achieves the adjustment of the optimal tuning frequency for a standard radio wave, but also enables application as a means for selection of a standard radio wave from a plurality of transmitting stations having different frequencies.

As described above, according to the fourth embodiment of the present invention, because the storage circuit 53, which stores tuning control information, is within the tuning IC 100, it is possible to achieve clear separation of the functions of the controller 50, which control the radio-controlled timepiece, and the tuning circuit 100, which receives the standard radio wave, thereby enabling simplification of the manufacturing process and reduction of the cost of the tuning circuit. That is, there are individual differences that appear due to manufacturing variations in inductances between receiving antennas, as well as differences in capacitance among the plurality of capacitors within the tuning IC 101 caused by manufacturing variations.

For this reason, even in a tuning apparatus receiving one and the same standard radio wave, in order to achieve the optimal tuning, the tuning information for the purpose of switching the capacitors will differ between individual tuning apparatuses. Accordingly in the process of manufacturing the tuning circuit 100, therefore, if storage circuits 53 having stored therewithin different tuning control information for each one of the tuning circuit 100, respectively, are incorporated within the tuning circuits 100, it is possible to simplify the adjusting step thereof and reduce the number of process steps for its adjustment, and also possible to easily facilitate process control that enables separate control of the tuning circuit 100 and the controller 50. Additionally, the tuning apparatus is not limited to a radio-controlled timepiece, but can also be applied widely to various electronic apparatuses that receive a radio wave.

Next, the tuning apparatus of the present invention and the method of adjusting the tuning of the antenna of a radio-controlled timepiece using same will be described. In the past, the adjustment of the antenna tuning in a radio-controlled timepiece was done by preparing a number of types of capacitors for tuning after the capacitance are tentatively mounted on the tuning circuit, the measurement operation for measuring the frequency is performed and, if the tuned frequency was offset, by removing a mounted capacitor and replacing it with a different capacitor having a different capacitance from that of the resistant capacitor.

After which the tuned frequency was measured again.

This method requiring much time and effort. However, it is possible in a tuning apparatus and in a radio-controlled timepiece using same to perform the antenna tuning adjustment both quickly and automatically in the present invention, as described below.

Specifically, a feature of a radio-controlled timepiece according to the present invention is the provision of a test mode, in which an external operating means provided external to the radio-controlled timepiece can change the tuned frequency.

FIG. 10 shows the principle of the antenna tuning adjustment method of a radio-controlled timepiece, in which FIG. 10(*a*) is a drawing showing the principle of a contact-type of antenna tuning adjustment method, and FIG. 10(*b*) is a drawing showing the principle of a non-contact type of antenna tuning adjustment method. In FIG. 10(*a*), 40*a* is a radio-controlled timepiece similar to the third and fourth embodiments of the present invention, these having as described earlier a tuning circuit 1 and a controller 50, the tuning circuit 1 having a receiving antenna 2 and a tuning IC 3.

The radio-controlled timepiece 40*a* has an interface circuit 110 (I/F circuit) as a means of externally applying control information. 111 is an automatic adjustment apparatus, which automatically adjusts the antenna tuning of the radio-controlled timepiece 40*a* and, although not shown in the drawing, has an internal AC signal generator, an AC voltmeter, and a controller that is a microcomputer or the like. 112 is a air-core excitation coil, which is driven by an AC signals P20*a* and P20*b* that are output from the automatic adjustment apparatus 111, and which outputs an AC magnetic field 113. P21 is a control signal, which is output from the automatic adjustment apparatus 111, this control signal passing through the interface 110 (I/F circuit) and being input to the controller 50.

Next, the method of adjustment of the antenna tuning will be described below, based on FIG. 10(*a*). In order to adjust the antenna tuning of the radio-controlled timepiece 40*a*, the air-core excitation coil 112 is first brought into proximity of the receiving antenna 2 of the radio-controlled timepiece 40*a*.

The automatic adjustment apparatus 111 first outputs the AC signals P20*a* and P20*b*, thereby driving the air-core excitation coil 112. For example, in the case in which it is desired to tune the radio-controlled timepiece 40*a* to the standard radio wave of 40 kHz, 40 kHz AC signals P20*a* and P20*b* are output, and if it is desired to tune the radio-controlled timepiece 40*a* to the standard radio wave of 60 kHz, 60 kHz AC signals P20*a* and P20*b* are output.

Next, the automatic adjustment apparatus 111 outputs a control signal P21 so as to operate the controller 50 via the interface 110 (I/F circuit), the controller 50 in response to the control signal P21 sequentially outputting to the tuning IC 3 the clock signal P8. The tuning IC 3 inputs the clock signal P8 and switches internal capacitors in accordance with the number of pulses of the clock signal P8, so as to change the tuned frequency.

At this point, the receiving antenna 2 receives an AC magnetic field 113 from the air-core excitation coil 112 and it is excited by electromagnetic induction to induce electromotive force, and outputs the antenna signals P6 and P7.

The tuning IC 3 inputs the antenna signals P6 and P7, and outputs a tuning signal P10. When this is done, when the frequency of the AC signals P20*a* and P20*b* coincide with the tuned frequency of the receiving antenna 2 and the capacitors in the tuning IC 3, the signal level of the tuning signal P10 increases and reaches a peak.

The automatic adjustment apparatus 111 inputs and internally amplifies the tuning signal P10, measures the amplified tuned signal P10 using an AC voltmeter, and stores this as the antenna output from the receiving antenna 2. FIG. 11 is a graph of the antenna output characteristics obtained by measuring the antenna output while varying the number of pulses in the clock signal P8, using the automatic adjustment apparatus 111.

In FIG. 11, in the region in which there are few pulses in the clock signal P8, the antenna output (that is, the signal level of the tuning signal P10) is small, the antenna output increasing as the number of pulses is increased, reaching a maximum antenna output in the region of 28 pulses, after which a further increase in the number of pulses brings a reduction in the antenna output.

That is, from the antenna characteristics of FIG. 11, it can be understood that the tuned frequency coincides with the frequency of the AC signals P20*a* and P20*b* in the region of 28 pulses. From this, if the number of pulses at which the antenna output is maximum is stored as tuning control information in the controller 50 or in a storage circuit within the tuning circuit 1, it is possible to tune the tuning circuit 1 to a standard radio wave with high precision, and to achieve a radio-controlled timepiece with high sensitivity and noise immunity.

In the case of receiving a plurality of standard radio waves, if the AC signals P20a and P20b are each set to frequencies equal to the standard radio wave frequencies and the same type of measurement is performed, the number of pulses at which the peaks are encountered being stored, it is possible to arbitrarily receive a signal of a plurality of standard radio waves.

In FIG. 11, in the case of a low-Q value tuning circuit, there are cases in which the peak is a gentle one, making it difficult to determine the peak point. In such cases, it is possible to use computer program to predict the peak point of tuning, for example, by calculating the rising slope of the antenna output (K1) and the falling slope of the antenna output (K2), as shown in FIG. 11 by using a micro-computer provided in the automatic adjusting apparatus 111, and taking the peak to be at the point of intersection of the slopes K1 and K2.

As described above, because it is possible to implement the adjustment of the antenna tuning of a radio-controlled timepiece using the air-core excitation coil 112 and the automatic adjustment apparatus 111, it is not only possible to simplify the process of manufacturing a radio-controlled timepiece, but also possible to reduce the number of adjustment steps.

Next, the configuration and method of the non-contact antenna adjustment will be described, based on FIG. 10(b), in which elements that are the same as in FIG. 10(a), showing the contact type of adjustment, are assigned the same reference numerals and are not described herein.

In FIG. 10(b), 115 is an air-core detection coil, which is disposed in proximity to the receiving antenna 2. P22a and P22b are detection signals, which are induced in the air-core detection coil 115, these being input to the automatic adjustment apparatus 111. 116 is a wireless interface (I/F) circuit within the radio-controlled timepiece 40a, which receives wireless control signal P23 output as infrared or a weak radio wave or the like from the automatic adjustment apparatus 111, and which transmits that control signal to the controller 50.

That is, it is desirable that the external operating means used in executing the test mode in the present invention includes a non-contact type operating method, and further preferable that the non-contact operating method be either radio or infrared.

Next, the method of adjusting the antenna tuning with non-contact type system will be described below, based on FIG. 10(b). In order to adjust the antenna tuning of the radio-controlled timepiece 40a, the automatic adjustment apparatus 111 first outputs the AC signals P20a and P20b and drives the air-core excitation coil 112.

The receiving antenna 2 receives the AC magnetic field 113 from the air-core excitation coil 112 and has induced therein an electromotive force and outputs the antenna signals P6 and P7. The antenna signals P6 and P7 induced in the receiving antenna 2 generate an AC magnetic field 117 from the receiving antenna 2.

The air-core detection coil 115 brought into proximity of the receiving antenna 2 receives the AC magnetic field 117, thereby induce in it an electromotive force by the AC magnetic field 117, and outputs the detection signals P22a and P22b.

Next, the automatic adjustment apparatus 111 inputs and internally amplifies the detection signals P22a and P22b, measures the amplified detection signals P22a and P22b using an AC voltmeter, and stores this as the antenna output from the receiving antenna 2.

The switching control of the capacitors within the tuning IC 3 is performed sequentially by means of a wireless control signal P23 that is output from the automatic adjustment apparatus 111. As a result, it is possible for the automatic adjustment apparatus 111 to obtain the same type of antenna characteristics data as shown in FIG. 11, and possible to determine the peak point in the antenna output.

That is, according to this non-contact type of antenna tuning adjustment method, because it is possible to detect the antenna output using the air-core detection coil 115, and because switching of the capacitors in order to change the tuned frequency of the tuning circuit is performed by the wireless control signal P23, it is possible to perform adjustment of the antenna tuning in a completely contactless manner respective of the radio-controlled timepiece 40a.

The above means that, because it is possible to perform non-contact antenna tuning adjustment after the radio-controlled timepiece is placed into an exterior part, which is desirable. There is a tendency for the tuned frequency to be shifted, between a case in which the frequency is measured before the radio-controlled timepiece is placed in the exterior part and a case in which the frequency is measured after it is placed in the exterior part, because there must be a difference in floating and parasitic capacitances.

But if the antenna tuning is adjusted after placing it in the exterior part, the shift in the tuned frequency caused by the exterior part can be cancelled out, enabling the achievement of more precise antenna tuning adjustment.

Additionally, by enabling non-contact adjustment, it is further possible to simplify the process of manufacturing thereof, and to further reduce the adjustment steps. It is not only possible to reduce the adjustment steps at the time of manufacturing, but also possible to re-adjust the antenna tuning without opening the exterior part, should the antenna tuning become shifted for some reason while the radio-controlled timepiece is in use, thereby achieving a great effect in performing maintenance of radio-controlled timepiecees.

Yet another embodiment of the present invention, as is clear from the foregoing description, is a radio-controlled timepiece having tuning circuit 1 and a control means, which controls each of the tuning circuits 1 indicated above for the various embodiments and which has a receiving circuit that inputs a standard radio wave by the tuning circuit 1 and performs time adjustment, and a display means 42, which indicates the time information from the control means 6.

Yet another embodiment of a radio-controlled timepiece according to the present invention is a radio-controlled timepiece having a metal exterior part made of a metallic material cover, which covers the tuning circuit 1 and the control means 6, so as to provide mechanical protection therefor.

A feature of yet another embodiment of the present invention is a radio-controlled timepiece in that the inductance of the coil of the tuning circuit covered by a metal exterior part is 20 mH or greater, and that the opening and closing of a plurality of semiconductor switch of the tuning circuit are controlled so as to vary the tuned frequency, thereby selecting one of a plurality of standard radio waves for reception.

Yet another embodiment of a radio-controlled timepiece according to the present invention can have a tuning information storage means for storing tuning control information for the purpose of varying the tuned frequency of the tuning circuit, and it is preferable that the tuning control information storage means be provided within the tuning circuit.

Additionally, it is desirable that the tuning control information storage means be selected from a group consisting of a pattern-cutting means, a fuse ROM, and a non-volatile memory.

As is clear from the above description, because the present invention switches a plurality of capacitors by the opening and closing of semiconductor switches, it is possible for the present invention to provide a tuning circuit and radio-controlled timepiece using same, which arbitrarily varies the tuned frequency and can vary the tuned frequency widely, and which features superior stability, compactness, and high performance.

What is claimed is:

1. A radio controlled timepiece comprising following items incorporated into an exterior part:
   a tuning circuit comprising a semiconductor substrate which comprises a plurality of semiconductor switches, a plurality of first capacitors, connected each in series with said plurality of semiconductor switches, switch controlling means for controlling opening and closing of said semiconductor switches, and a coil connected in parallel to said plurality of first capacitors;
   wherein the total electrostatic capacitance of said plurality of first capacitors is varied according to the electrostatic capacitance corresponding to a standard radio wave that includes time information by said switch controlling means individually controlling said opening and closing of said plurality of semiconductor switches connected to said plurality of first capacitors, so as to vary a tuned frequency of a tuning circuit formed by said plurality of first capacitors and said coil;
   a control means, which controls said tuning circuit, and which has a receiving circuit, which inputs a standard radio wave received by said tuning circuit and performs time correction; and
   a display means, which displays time information from said control means;
   a wireless interface circuit that wirelessly receives a control signal for making said control means execute a control of changing the tuned frequency by opening and closing said semiconductor switches respectively and tuning control information for setting the tuned frequency; and
   a tuning control information memory that stores the tuning control information.

2. The radio-controlled timepiece according to claim 1, wherein the exterior part is made of a metal material.

3. The radio-controlled timepiece according to claim 1, comprising a test mode, whereby it is possible to change a tuned frequency by an external operating means provided outside said radio-controlled timepiece,
   wherein the wireless interface circuit receives the control signal and the tuning control information in the test mode.

4. The radio-controlled timepiece according to claim 1, wherein said tuning control information memory is provided within said tuning circuit.

5. The radio-controlled timepiece according to claim 1, wherein, by controlling the opening and closing of said plurality of semiconductor switches of said tuning circuit so as to vary said tuned frequency, it is possible to selectively receive any of a plurality of standard radio waves.

6. The radio-controlled timepiece according to claim 1, further comprising, either on said semiconductor substrate or outside said semiconductor substrate, a second capacitor, which has either a fixed capacitance or a variable capacitance, and which is connected to said coil in parallel with said group of first capacitors.

7. The radio-controlled timepiece according to claim 6, wherein at least one of said second capacitances is controlled by said switch controlling means via said semiconductor switch provided on said semiconductor substrate.

8. The radio-controlled timepiece according to claim 6, wherein said electrostatic capacitance of said second capacitor is larger than that of said first capacitor.

* * * * *